(12) United States Patent
Lee et al.

(10) Patent No.: US 11,910,687 B2
(45) Date of Patent: Feb. 20, 2024

(54) DISPLAY PANEL AND ELECTRONIC DEVICE

(71) Applicant: SAMSUNG DISPLAY CO., LTD., Yongin-si (KR)

(72) Inventors: Hyeonbum Lee, Yongin-si (KR); Seongmin Wang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/555,926

(22) Filed: Dec. 20, 2021

(65) Prior Publication Data

US 2022/0406851 A1 Dec. 22, 2022

(30) Foreign Application Priority Data

Jun. 22, 2021 (KR) .................. 10-2021-0081040

(51) Int. Cl.
*G09G 3/32* (2016.01)
*H10K 59/38* (2023.01)
(Continued)

(52) U.S. Cl.
CPC .......... *H10K 59/38* (2023.02); *H10K 50/844* (2023.02); *H10K 50/865* (2023.02);
(Continued)

(58) Field of Classification Search
CPC . H01L 27/322; H01L 27/3216; H01L 27/323; H01L 27/3246; H01L 51/5253; H01L 51/5284; H10K 59/38; H10K 59/40; H10K 59/122; H10K 50/865; H10K 59/352; H10K 50/844
(Continued)

(56) References Cited

U.S. PATENT DOCUMENTS 10,366,772 B2 7/2019 He et al.
2020/0365667 A1* 11/2020 Jo ...................... H01L 27/326
(Continued)

FOREIGN PATENT DOCUMENTS

CN 110289298 A 9/2019
CN 110444125 A 11/2019
(Continued)

*Primary Examiner* — Jennifer T Nguyen
(74) *Attorney, Agent, or Firm* — CANTOR COLBURN LLP

(57) ABSTRACT

A display panel includes: a substrate including a component area and a main area surrounding at least a portion of the component area, the component area including a pixel area and a transmission area; a display element layer on the substrate, the display element layer including a first display element overlapping the pixel area of the component area in a plan view, a second display element overlapping the pixel area of the component area, and a pixel defining layer defining therein a first opening and a second opening defining an emission area of the first display element and an emission area of the second display element, respectively; and an anti-reflective layer on the display element layer, the anti-reflective layer including a black matrix defining therein a first upper opening overlapping the first opening and the second opening, and a first color filter overlapping the first upper opening.

20 Claims, 17 Drawing Sheets

(51) Int. Cl.
  *H10K 50/844* (2023.01)
  *H10K 50/86* (2023.01)
  *H10K 59/40* (2023.01)
  *H10K 59/122* (2023.01)
  *H10K 59/35* (2023.01)
(52) U.S. Cl.
  CPC ......... *H10K 59/122* (2023.02); *H10K 59/352* (2023.02); *H10K 59/40* (2023.02)
(58) Field of Classification Search
  USPC .......................................................... 345/83
  See application file for complete search history.

(56) References Cited

U.S. PATENT DOCUMENTS

| | | | |
|---|---|---|---|
| 2020/0403039 A1* | 12/2020 | Park | ........................ H10K 50/86 |
| 2021/0359047 A1 | 11/2021 | Yoon et al. | |
| 2022/0149335 A1* | 5/2022 | Hai | .................... H01L 27/3246 |
| 2022/0208883 A1* | 6/2022 | Kim | .................... H01L 51/5218 |
| 2022/0209171 A1* | 6/2022 | Lee | ..................... H01L 27/3246 |

FOREIGN PATENT DOCUMENTS

| | | |
|---|---|---|
| CN | 110658952 A | 1/2020 |
| KR | 1020210142808 A | 11/2021 |

\* cited by examiner

DISPLAY PANEL AND ELECTRONIC DEVICE

This application claims priority to Korean Patent Application No. 10-2021-0081040, filed on Jun. 22, 2021, and all the benefits accruing therefrom under 35 U.S.C. § 119, the content of which in its entirety is herein incorporated by reference.

BACKGROUND

1. Field

One or more embodiments relate to a display panel and an electronic device.

2. Description of the Related Art

Usage of a display device has diversified. Also, a display panel included in the display device has become thinner and more lightweight, and thus, the use of the display panel has expanded.

While increasing the area occupied by a display area in an electronic device, various functions have been connected or linked to the display area therein. In order to increase the area and add various functions, research has been conducted into an electronic device having a component area for performing various functions while displaying an image.

SUMMARY

One or more embodiments include a display panel and an electronic device, in which light transmittance of the display panel in a component area of the display panel is increased and light reflectance is reduced.

Additional aspects will be set forth in part in the description which follows and, in part, will be apparent from the description, or may be learned by practice of the presented embodiments of the disclosure.

According to one or more embodiments, an electronic device includes: a housing having a rear surface and a side surface; a cover window on the housing; a display panel below the cover window; and a component between the housing and the display panel. The display panel includes: a substrate including a component area and a main area surrounding at least a portion of the component area, where the component area includes a pixel area and a transmission area and overlaps the component in a plan view; a display element layer on the substrate, where the display element layer includes a first display element overlapping the pixel area of the component area in the plan view, a second display element overlapping the pixel area of the component area in the plan view, and a pixel defining layer defines therein a first opening and a second opening, and the first opening and the second opening define therein an emission area of the first display element and an emission area of the second display element, respectively; and an anti-reflective layer on the display element layer, where the anti-reflective layer includes a black matrix defining therein a first upper opening overlapping the first opening and the second opening, and a first color filter overlapping the first upper opening in the plan view.

In an embodiment, the display element layer may further include a third display element overlapping the pixel area of the component area and a fourth display element overlapping the pixel area of the component area in the plan view, the pixel defining layer may further define therein a third opening and a fourth opening defining an emission area of the third display element and an emission area of the fourth display element, respectively, and the black matrix may further define therein a second upper opening overlapping the third opening and the fourth opening in the plan view.

In an embodiment, a distance between the first opening and the second opening may be less than a distance between the second opening and the third opening in the plan view.

In an embodiment, the first display element, the second display element, the third display element, and the fourth display element may emit light of the same color.

In an embodiment, the first color filter may overlap the first upper opening and the second upper opening in the plan view.

In an embodiment, the display element layer may further include: a first adjacent display element overlapping the pixel area of the component area in the plan view and which emits light in a wavelength band different from a wavelength band of light emitted from the first display element; and a second adjacent display element overlapping the pixel area of the component area in the plan view and which emits light in a wavelength band different from the wavelength bands of the lights emitted from the first display element and the first adjacent display element, the pixel defining layer may further define therein a first adjacent opening and a second adjacent opening defining an emission area of the first adjacent display element and an emission area of the second adjacent display element, respectively, the black matrix may further define therein a first adjacent upper opening overlapping the first adjacent opening and a second adjacent upper opening overlapping the second adjacent opening in the plan view, and the anti-reflective layer may further include a second color filter overlapping the first adjacent upper opening and a third color filter overlapping the second adjacent upper opening in the plan view.

In an embodiment, a planar area of the first adjacent upper opening may be greater than a planar area of the first adjacent opening in the plan view.

In an embodiment, the pixel area of the component area may include a first pixel area and a second pixel area, the transmission area of the component area may include a first transmission area and a second transmission area each adjacent to the first pixel area and the second pixel area, and the first color filter may extend from the first pixel area to the second pixel area and be disposed between the first transmission area and the second transmission area.

In an embodiment, the display panel may further include a touch sensor layer between the display element layer and the anti-reflective layer, the touch sensor layer may include a touch conductive pattern, the black matrix may overlap the touch conductive pattern in the plan view, the touch conductive pattern may extend between the first adjacent opening and the second adjacent opening in the plan view, the touch conductive pattern may extend between the second opening and the third opening in the plan view, and the touch conductive pattern may surround at least part of the first opening, the second opening, and the pixel defining layer between the first opening and the second opening in the plan view.

In an embodiment, the display element layer may further include a plurality of display elements overlapping the main area in the plan view and which emit light in the same wavelength band as a wavelength band of light emitted from the first display element, the pixel defining layer of the display element layer may further define a plurality of openings defining a plurality of emission areas of the plurality of display elements overlapping the main area in the plan view, the anti-reflective layer may further include a plurality of color filters overlapping the main area in the plan view, the black matrix of the anti-reflective layer may further define therein a plurality of upper openings overlapping the plurality of openings in the main area, respectively, in the plan view, and the plurality of color filters of the anti-reflective layer may overlap the plurality of upper openings, respectively, in the plan view.

According to one or more embodiments, a display panel includes: a substrate including a component area and a main area surrounding at least a portion of the component area, where the component area includes a pixel area and a transmission area; a display element layer on the substrate, where the display element layer includes a first display element overlapping the pixel area of the component area in the plan view, a second display element overlapping the pixel area of the component area in the plan view, and a pixel defining layer defining therein a first opening and a second opening, and the first opening and the second opening define an emission area of the first display element and an emission area of the second display element, respectively; and an anti-reflective layer on the display element layer, where the anti-reflective layer includes a black matrix defining therein a first upper opening overlapping the first opening and the second opening, and a first color filter overlapping the first upper opening in the plan view.

In an embodiment, the display element layer may further include a third display element overlapping the pixel area of the component area and a fourth display element overlapping the pixel area of the component area in the plan view, the pixel defining layer may further define therein a third opening and a fourth opening defining an emission area of the third display element and an emission area of the fourth display element, respectively, and the black matrix may further define therein a second upper opening overlapping the third opening and the fourth opening in the plan view.

In an embodiment, a distance between the first opening and the second opening may be less than a distance between the second opening and the third opening in the plan view.

In an embodiment, the first display element, the second display element, the third display element, and the fourth display element may emit light of the same color.

In an embodiment, the first color filter may overlap the first upper opening and the second upper opening in the plan view.

In an embodiment, the display element layer may further include a first adjacent display element overlapping the pixel area of the component area in the plan view and which emits light in a wavelength band different from a wavelength band of light emitted from the first display element, and a second adjacent display element overlapping the pixel area of the component area in the plan view and which emits light in a wavelength band different from the wavelength bands of the lights emitted from the first display element and the first adjacent display element, the pixel defining layer may further define therein a first adjacent opening and a second adjacent opening defining an emission area of the first adjacent display element and an emission area of the second adjacent display element, respectively, the black matrix may further define therein a first adjacent upper opening overlapping the first adjacent opening and a second adjacent upper opening overlapping the second adjacent opening in the plan view, and the anti-reflective layer may further include a second color filter overlapping the first adjacent upper opening and a third color filter overlapping the second adjacent upper opening in the plan view.

In an embodiment, a planar area of the first adjacent upper opening may be greater than a planar area of the first adjacent opening in the plan view.

In an embodiment, the pixel area of the component area may include a first pixel area and a second pixel area, the transmission area of the component area may include a first transmission area and a second transmission area each adjacent to the first pixel area and the second pixel area, and the first color filter may extend from the first pixel area to the second pixel area and be disposed between the first transmission area and the second transmission area.

In an embodiment, the display panel may further include: a touch sensor layer between the display element layer and the anti-reflective layer, the touch sensor layer may include a touch conductive pattern, the black matrix may overlap the touch conductive pattern in the plan view, the touch conductive pattern may extend between the first adjacent opening and the second adjacent opening in the plan view, the touch conductive pattern may extend between the second opening and the third opening in the plan view, and the touch conductive pattern may surround at least part of the first opening, the second opening, and the pixel defining layer between the first opening and the second opening in the plan view.

In an embodiment, the display element layer may further include a plurality of display elements overlapping the main area in the plan view and which emit light in the same wavelength band as a wavelength band of light emitted from the first display element, the pixel defining layer of the display element layer may further define therein a plurality of openings defining a plurality of emission areas of the plurality of display elements overlapping the main area in the plan view, the anti-reflective layer may further include a plurality of color filters overlapping the main area in the plan view, the black matrix of the anti-reflective layer may further define therein a plurality of upper openings overlapping the plurality of openings in the main area, respectively, in the plan view, and the plurality of color filters of the anti-reflective layer may overlap the plurality of upper openings, respectively, in the plan view.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
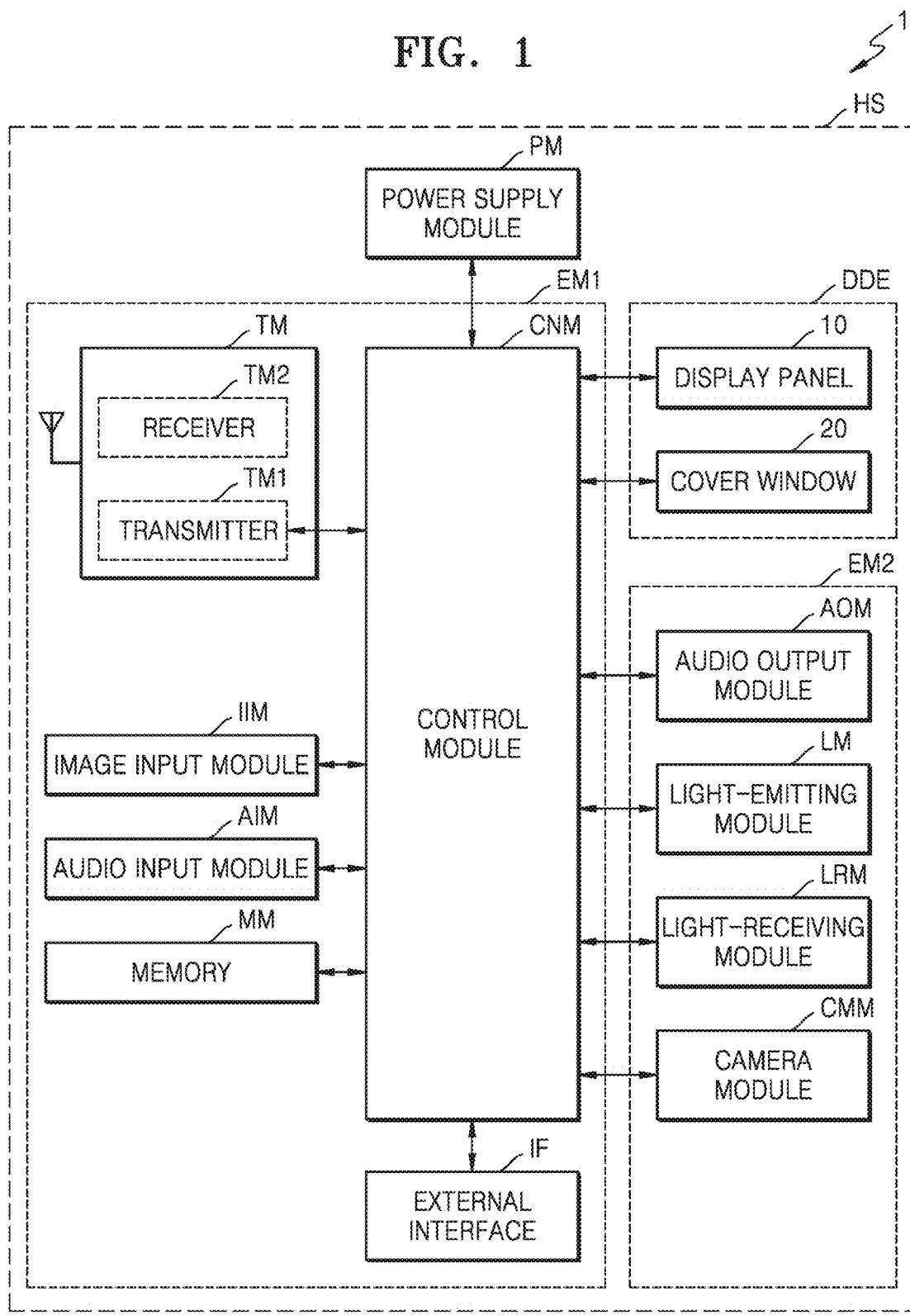
FIG. 1 is a block diagram of an electronic device according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise. For example, "an element" has the same meaning as "at least one element," unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

FIG. 1 is a block diagram of an electronic device 1 according to an embodiment.

Referring to FIG. 1, the electronic device 1 may be a device that displays a moving image or a still image. In an embodiment, the electronic device 1 may be portable electronic devices such as mobile phones, smart phones, tablet personal computers ("PCs"), mobile communication terminals, electronic organizers, e-books, portable multimedia players ("PMPs"), navigations, and/or ultra mobile PCs ("UMPCs"). In another embodiment, the electronic device 1 may be various products such as televisions, laptops, monitors, billboards, and/or internet of things ("IoT") devices. In another embodiment, the electronic device 1 may be wearable devices such as smart watches, watch phones, glasses-type displays, and/or head mounted displays ("HMDs"). In another embodiments, the electronic device 1 may also be arranged in dashboards of automobiles, center information displays ("CIDs") on the center fascia or dashboards of automobiles, room mirror displays replacing side mirrors of automobiles, and the rear sides of front seats to serve as entertainment devices for backseat passengers of automobiles.

The electronic device 1 may include a housing HS, a display device DDE, a power supply module PM, a first electronic module EM1, and a second electronic module EM2. The display device DDE may include a display panel 10 and a cover window 20. The housing HS may define the outer appearance of the electronic device 1 together with the cover window 20. In an embodiment, the housing HS may include an inner surface defining an accommodation space. The display panel 10, the power supply module PM, the first electronic module EM1, and the second electronic module EM2 may be accommodated in the accommodation space. The display panel 10, the power supply module PM, the first electronic module EM1, and the second electronic module EM2 may be electrically connected to each other.

The display device DDE may display an image. The display panel 10 may emit light to display an image. The cover window 20 may be on the display panel 10. The cover window 20 may prevent or reduce damage to the display panel 10. In some embodiments, the display device DDE may further include an input sensor configured to detect an external input.

The power supply module PM may supply power required for overall operations of the electronic device 1. The power supply module PM may include a typical battery module.

The first electronic module EM1 may include various functional modules for operating the electronic device 1.

The first electronic module EM1 may be directly mounted on a motherboard electrically connected to the display panel 10, or may be mounted on a separate board and electrically connected to the motherboard through a connector.

The first electronic module EM1 may include a control module CNM, a wireless communication module TM, an image input module IIM, an audio input module AIM, a memory MM, and an external interface IF. Some of the control module CNM, the wireless communication module TM, the image input module IIM, the audio input module AIM, the memory MM, and the external interface IF may be electrically connected to the motherboard through a flexible circuit board, instead of being mounted on the motherboard.

The control module CNM may control overall operations of the electronic device 1. The control module CNM may include a microprocessor. In an embodiment, the control module CNM may activate or deactivate the display panel 10. The control module CNM may control other modules, for example, the image input module IIM or the audio input module AIM, based on a touch signal received from the display panel 10.

The wireless communication module TM may transmit and/or receive a signal to and/or from another terminal by using at least one of radio frequency ("RF"), Bluetooth, Wi-Fi, wireless local area network ("LAN"), infrared communication, ultra wideband ("UWB"), ZigBee, and near field communication ("NFC"). The wireless communication module TM may transmit and/or receive a voice signal by using a general communication line. The wireless communication module TM may include a transmitter TM1 configured to transmit a signal to be transmitted and a receiver TM2 configured to demodulate a received signal.

The image input module IIM may process an image signal to convert the image signal into image data that may be displayed on the display panel 10. The audio input module AIM may receive an external audio signal through a microphone in a recording mode or a voice recognition mode and convert the external audio signal into electrical voice data.

The external interface IF may act as an interface connected to an external charger, a wired and/or wireless data port, and a card socket. The card socket may include at least one of a memory card, a subscriber identification module ("SIM") card, and a user identification module ("UIM") card. Although FIG. 1 illustrates that the external interface IF is arranged inside the housing HS, the external interface IF may be arranged outside the housing HS.

The second electronic module EM2 may include an audio output module AOM, a light-emitting module LM, a light-receiving module LRM, and a camera module CMM. The second electronic module EM2 may be directly mounted on the motherboard, may be mounted on a separate board and electrically connected to the display panel 10 through a connector, or may be electrically connected to the first electronic module EM1.

The audio output module AOM may convert audio data received from the wireless communication module TM or audio data stored in the memory MM and output the resulting data to the outside.

The light-emitting module LM may generate and output light. The light-emitting module LM may output infrared light. In an embodiment, the light-emitting module LM may include a light-emitting diode ("LED") element. The light-receiving module LRM may detect infrared light. The light-receiving module LRM may be activated when infrared light having a certain level or more is detected. In an embodiment, the light-receiving module LRM may include a complementary metal-oxide semiconductor ("CMOS") sensor. After infrared light generated by the light-emitting module LM is output, the infrared light may be reflected by an external object (e.g., a user's finger or face), and the reflected infrared light may be incident on the light-receiving module LRM.

The camera module CMM may capture an external image.

In an embodiment, at least one of elements of the first electronic module EM1 and the second electronic module EM2 may be defined as a component. For example, the component may include at least one of a camera, a speaker, a light sensor, and a thermal sensor. The component may detect an external subject or provide a sound signal such as a voice to the outside. The component may include a plurality of components, and is not limited to any one embodiment.

Figure 2:
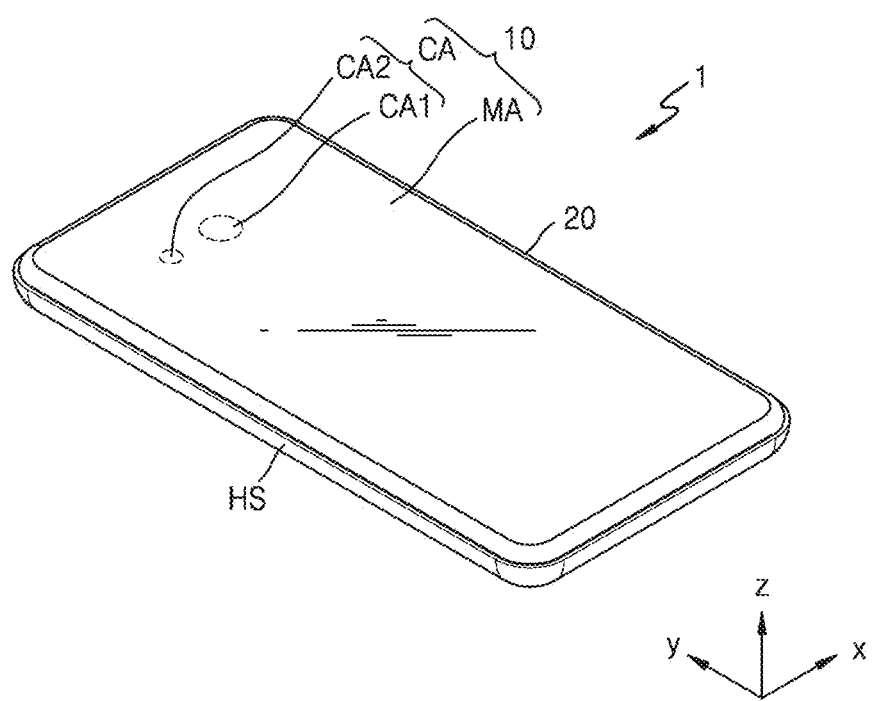
FIG. 2 is a schematic perspective view of an electronic device according to an embodiment.

FIG. 2 is a schematic perspective view of an electronic device 1 according to an embodiment.

Referring to FIG. 2, the electronic device 1 may include a housing HS, a display panel 10, and a cover window 20. The housing HS may include an inner surface defining an accommodation space. The housing HS may include a material having relatively high rigidity. For example, the housing HS may include a plurality of frames and/or plates including glass, plastic, metal, and/or any combination thereof. The housing HS may stably protect, from external impact, the components of the electronic device 1 accommodated in an internal space.

The display panel 10 may display an image. The display panel 10 may include a main area MA and a component area CA. In an embodiment, the main area MA may be a main display area. A plurality of display elements may be arranged in the main area MA, and the display elements may emit light. Therefore, the display panel 10 may display an image through the light emitted from the display elements. In an embodiment, the display element may include an organic light-emitting diode including an organic emission layer. Alternatively, the display element may include an LED. The size of the LED may be on a micro scale or a nano scale. For example, the LED may include a micro LED. Alternatively, the LED may include a nanorod LED. The nanorod LED may include gallium nitride (GaN). In an embodiment, a color conversion layer may be on the nanorod LED. The color conversion layer may include quantum dots. Alternatively, the display element may include a quantum dot LED including a quantum dot emission layer. Alternatively, the display element may include an inorganic LED including an inorganic semiconductor.

The component area CA may be an area in which an image is displayed, and may be an area overlapping components for adding various functions in a plan view (i.e., view from a third direction (e.g., z direction or −z direction)). A plurality of display elements may be arranged in the component area CA. At least a portion of the component area CA may be surrounded by the main area MA. In an embodiment, the component area CA may be completely surrounded by the main area MA. In an embodiment, the component area CA may include a first component area CA1 and a second component area CA2. In some embodiments, one of the first component area CA1 and the second component area CA2 may be omitted.

The cover window 20 may protect the display panel 10. In an embodiment, the cover window 20 may be coupled to the housing HS to define the outer appearance of the electronic device 1. The cover window 20 may include an insulating panel. For example, the cover window 20 may include glass, plastic, and/or any combination thereof. The cover window 20 may define a front surface of the electronic device 1.

The cover window 20 may include an optically transparent area. Therefore, the display panel 10 may display an image through the optically transparent area of the cover window 20. In an embodiment, the optically transparent area may be surrounded by a bezel area, and the shape of the optically transparent area may be defined by the bezel area. The light transmittance of the bezel area may be lower than the light transmittance of the optically transparent area. In an embodiment, the bezel area may include an opaque material that blocks light. In an embodiment, the bezel area may have a certain color. The bezel area may be defined by a bezel layer provided separately from a transparent substrate defining a transmission area, or may be defined by an ink layer inserted into or colored on the transparent substrate.

Figure 3A:
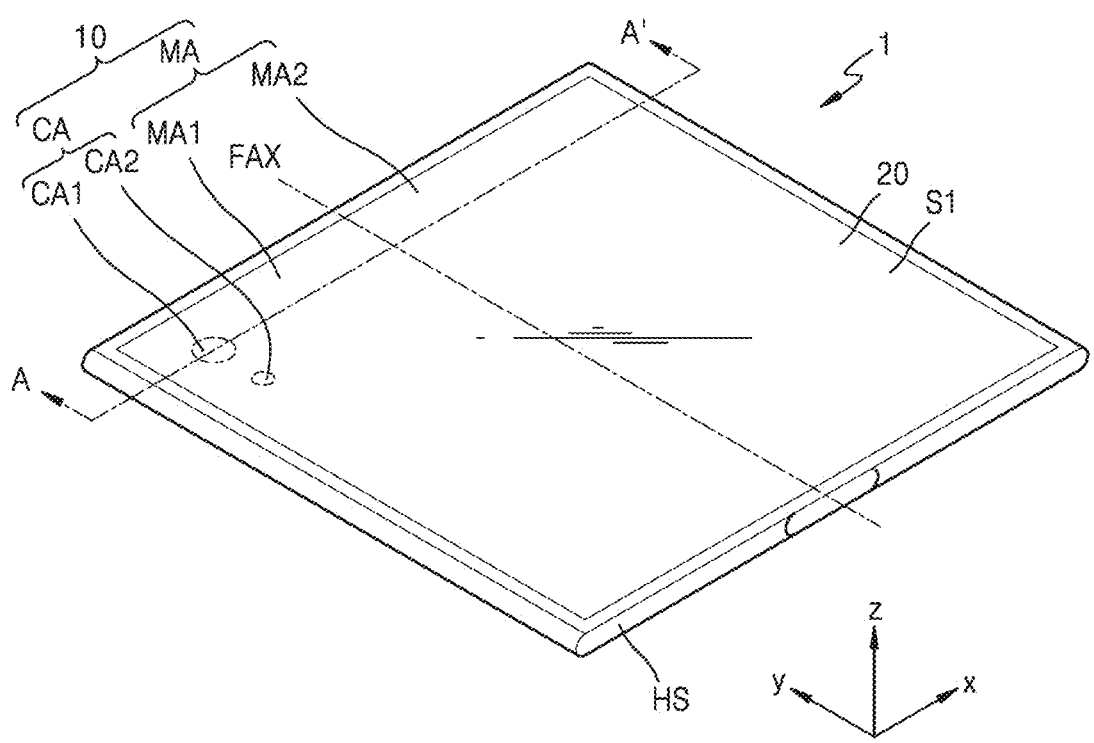
FIGS. 3A and 3B are schematic perspective views of an electronic device according to an embodiment.
Figure 3B:
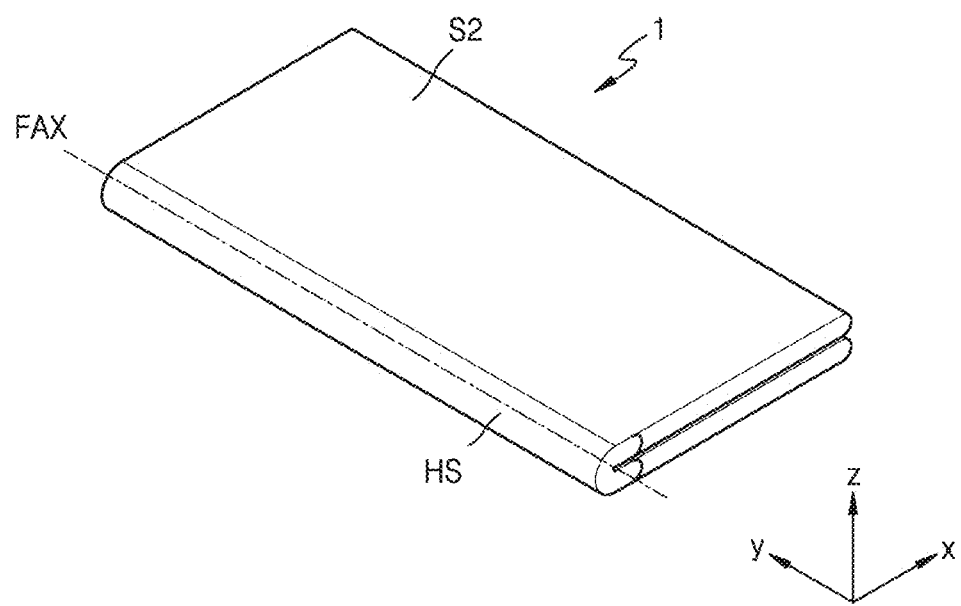

FIGS. 3A and 3B are schematic perspective views of an electronic device 1 according to an embodiment. FIG. 3A is a perspective view illustrating a state in which the electronic device 1 is unfolded, and FIG. 3B is a perspective view illustrating a state in which the electronic device 1 is folded. In FIGS. 3A and 3B, the same reference numerals as those in FIG. 2 denote the same members, and redundant descriptions thereof are omitted.

Referring to FIGS. 3A and 3B, the electronic device 1 may include a first surface 51 and a second surface S2 opposite to the first surface 51. The electronic device 1 may display an image on the first surface 51. In an embodiment, the first surface 51 may be a front surface of the electronic device 1. The second surface S2 may be a rear surface of the electronic device 1. In some embodiments, the electronic device 1 may also display an image on the second surface S2.

The electronic device 1 may be folded with respect to a folding axis FAX crossing the first surface 51. In an embodiment, the electronic device 1 may be folded so that a portion of the first surface 51 and another portion of the first surface 51 face each other. In an embodiment, the electronic device 1 may be folded so that a portion of the second surface S2 and another portion of the second surface S2 face each other.

In an embodiment, the folding axis FAX may extend in a first direction. In another embodiment, the folding axis FAX may extend in a second direction crossing the first direction. In an embodiment, the first direction and the second direction may form an acute angle. In an embodiment, the first direction and the second direction may form a right angle or an obtuse angle. Hereinafter, a detailed description will be given focusing on a case in which the first direction (e.g., x direction or −x direction) and the second direction (e.g., y direction or −y direction) are orthogonal to each other.

FIGS. 3A and 3B illustrate only one folding axis FAX, but in another embodiment, the electronic device 1 may include a plurality of folding axes FAX. Also, FIGS. 3A and 3B illustrate that the folding axis FAX extends in the second direction (e.g., y direction or −y direction), but in another embodiment, the folding axis FAX may extend in the first direction (e.g., x direction or −x direction), or may extend in a direction crossing the first direction (e.g., x direction or −x direction) and the second direction (e.g., y direction or −y direction).

The electronic device 1 may include a housing HS, a display panel 10, and a cover window 20. The display panel 10 may include a main area MA and a component area CA. In an embodiment, the main area MA may include a first main area MA1 and a second main area MA2 with the folding axis FAX therebetween. At least a portion of the component area CA may be surrounded by the main area MA. The component area CA may include a first component area CA1 and a second component area CA2. FIG. 3A illustrates that the component area CA is surrounded by the first main area MA1, but in another embodiment, the component area CA may be surrounded by the second main area MA2.

Figure 4:
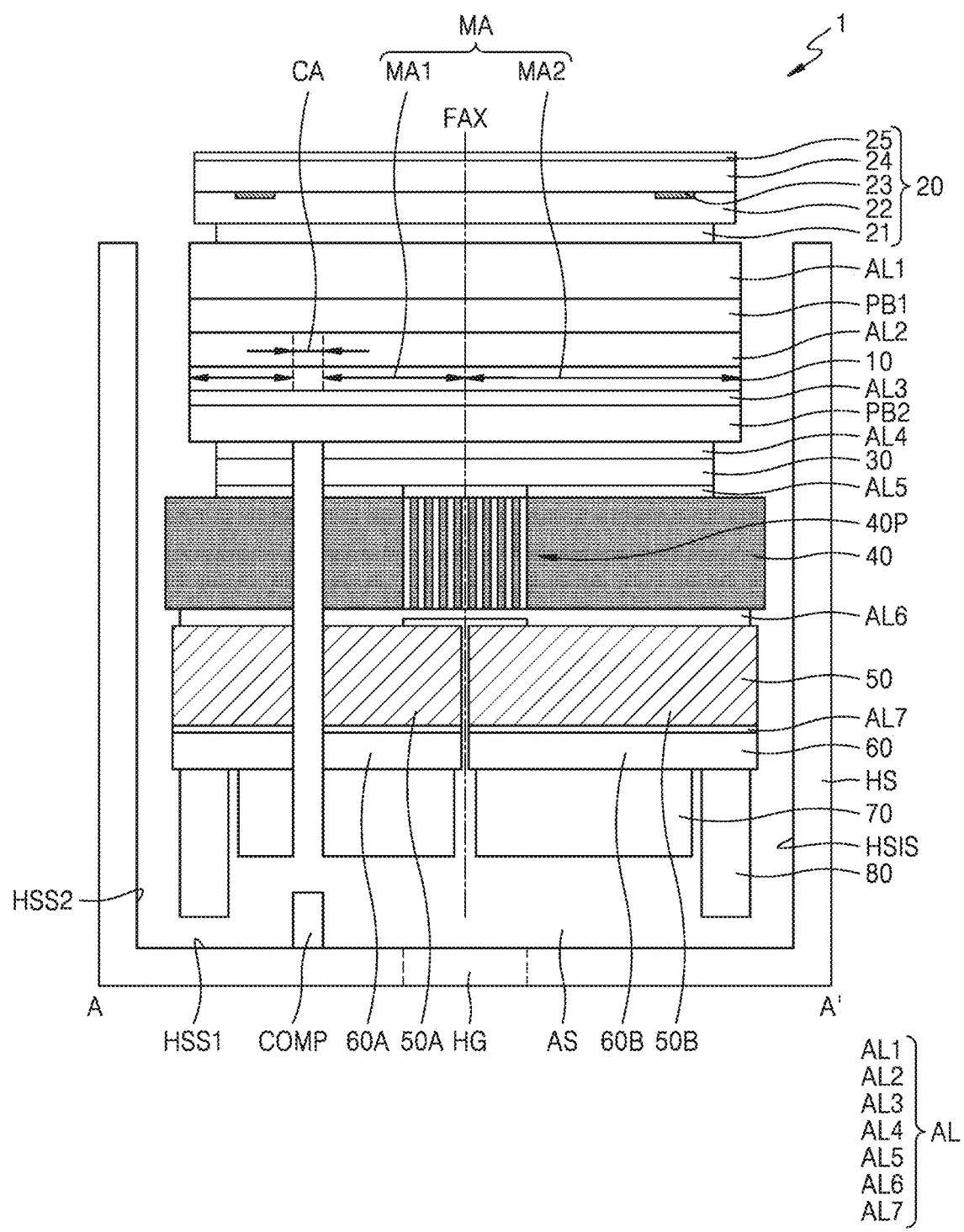
FIG. 4 is a schematic cross-sectional view of the electronic device taken along line A-A' of FIG. 3A, according to an embodiment.

FIG. 4 is a schematic cross-sectional view of the electronic device 1 taken along line A-A' of FIG. 3A, according to an embodiment.

Referring to FIG. 4, the electronic device 1 may include a housing HS, a display panel 10, a cover window 20, a first protective layer PB1, a second protective layer PB2, a first support layer 30, a second support layer 40, a digitizer 50, a plate 60, a cushion layer 70, a waterproof layer 80, an adhesive layer AL, and a component COMP.

The housing HS may include an inner surface HSIS defining an accommodation space AS. The inner surface HSIS of the housing HS may not be a surface constituting the outer appearance of the electronic device 1. In an embodiment, the housing HS may have a rear surface HSS1 and a side surface HSS2. The rear surface HSS1 and the side surface HSS2 may not be surfaces constituting the outer appearance of the electronic device 1. The display panel 10, the first protective layer PB1, the second protective layer PB2, the first support layer 30, the second support layer 40, the digitizer 50, the plate 60, the cushion layer 70, the waterproof layer 80, the adhesive layer AL, and the component COMP may face the inner surface HSIS of the housing HS.

The components of the electronic device 1 may be arranged in the accommodation space AS. In an embodiment, the display panel 10, the cover window 20, the first protective layer PB1, the second protective layer PB2, the first support layer 30, the second support layer 40, the digitizer 50, the plate 60, the cushion layer 70, the waterproof layer 80, the adhesive layer AL, and the component COMP may be arranged in the accommodation space AS. In an embodiment, the housing HS may include a hinge area HG overlapping the folding axis FAX in a plan view. Therefore, the housing HS may be folded around the folding axis FAX.

The display panel 10 may be below the cover window 20. In an embodiment, the display panel 10 may be arranged in the accommodation space AS. Therefore, the housing HS may protect the display panel 10. The display panel 10 may include a main area MA and a component area CA. In an embodiment, the component area CA may overlap the component COMP in a plan view. In an embodiment, the main area MA may include a first main area MA1 and a second main area MA2 with the folding axis FAX therebetween.

The cover window 20 may be on the display panel 10. In an embodiment, the cover window 20 may be on the housing HS. Although not illustrated, in an embodiment, the cover window 20 may be connected to the housing HS. The cover window 20 may include a window 21, a window adhesive layer 22, an opaque layer 23, a window protective layer 24, and a hard coating layer 25. In an embodiment, the window 21 may include ultra-thin glass. In another embodiment, the window 21 may include a polymer resin.

The window protective layer 24 may protect the window 21, and may prevent or reduce the occurrence of scratches on the upper surface of the window 21. The window protective layer 24 may be on the window 21. In an embodiment, the window protective layer 24 may include a polymer resin. In another embodiment, the window protective layer 24 may include an inorganic material.

The window adhesive layer 22 may be between the window protective layer 24 and the window 21. The window adhesive layer 22 may adhere the window protective layer 24 and the window 21 to each other. In an embodiment, the window adhesive layer 22 may include a pressure sensitive adhesive. In another embodiment, the window adhesive layer 22 may include an optically clear adhesive.

The opaque layer 23 may be between the window adhesive layer 22 and the window protective layer 24. In some embodiments, the opaque layer 23 may be a portion of the window protective layer 24. The opaque layer 23 may include an opaque material so that lines or circuits of the display panel 10 are not identified from the outside. Therefore, the opaque layer 23 may be a bezel area of the cover window 20.

The hard coating layer 25 may be on the window protective layer 24. The hard coating layer 25 may be the outermost layer of the cover window 20. The hard coating layer 25 may be the outermost layer of the electronic device 1. The hard coating layer 25 is a layer that a user directly touches, and may provide a smooth and soft touch feeling. In an embodiment, the hard coating layer 25 may include a polymer resin. In another embodiment, the hard coating layer 25 may include an inorganic material.

The first protective layer PB1 may be between the display panel 10 and the cover window 20. The first protective layer PB1 may protect the display panel 10 from external impact. In an embodiment, the first protective layer PB1 may include a polymer resin. The first protective layer PB1 may include, for example, a polymer resin such as polyethersulfone, polyacrylate, polyetherimide, polyethylene naphthalate, polyethylene terephthalate, polyphenylene sulfide, polyimide, polycarbonate, and/or cellulose acetate propionate. In another embodiment, the first protective layer PB1 may include a material such as glass and/or quartz.

The second protective layer PB2 may be below the display panel 10. In an embodiment, the display panel 10 may be between the first protective layer PB1 and the second protective layer PB2. The second protective layer PB2 may protect the display panel 10 from external impact. In an embodiment, the second protective layer PB2 may include a polymer resin. In another embodiment, the second protective layer PB2 may include an inorganic material.

The first support layer 30 may be below the second protective layer PB2. In an embodiment, the second protective layer PB2 may be between the display panel 10 and the first support layer 30. The first support layer 30 may be below the display panel 10 to support the display panel 10. The first support layer 30 may include a polymer material.

The second support layer 40 may be below the first support layer 30. In an embodiment, the first support layer 30 may be between the second protective layer PB2 and the second support layer 40. The second support layer 40 may be below the first support layer 30 to support the display panel 10.

The second support layer 40 may include a folding pattern 40P. The shape or length of the folding pattern 40P may be changed when the electronic device 1 is folded. For example, the folding pattern 40P may define an opening therein provided in the second support layer 40. In another embodiment, the folding pattern 40P may have an uneven shape. In another embodiment, the folding pattern 40P may include links rotatably connected to each other.

In an embodiment, when the electronic device 1 is folded, the folding pattern 40P may be folded around the folding axis FAX. In an embodiment, the folding pattern 40P may be provided so that opposite sides thereof are symmetrical about the folding axis FAX. In an embodiment, the second support layer 40 may have a flat upper surface in an area not including the folding pattern 40P.

The second support layer 40 may include at least one of glass, plastic, and metal. In an embodiment, the second support layer 40 may include polyurethane. In another embodiment, the second support layer 40 may include carbon fiber reinforced plastic ("CFRP"). In an embodiment, the folding pattern 40P may include the same material as that of the second support layer 40, or may include a material different from that of the second support layer 40.

The digitizer 50 may be below the second support layer 40. The second support layer 40 may be between the first support layer 30 and the digitizer 50. The digitizer 50 may include a body layer and/or a pattern layer. The digitizer 50 may detect a signal input from an external electronic pen or the like through the pattern layer. In particular, the digitizer 50 may detect the strength, direction, or the like of the signal input from the electronic pen or the like.

In an embodiment, the digitizer 50 may include a first digitizer 50A and a second digitizer 50B, which are spaced apart from each other with respect to the folding axis FAX. Therefore, when the electronic device 1 is folded, damage to the digitizer 50 may be prevented or reduced.

In an embodiment, at least one of the first digitizer 50A and the second digitizer 50B may overlap at least a portion of an area in which the electronic device 1 is folded in a plan view. Therefore, the digitizer 50 may receive a signal even in the area in which the electronic device 1 is folded, and user convenience may be improved.

The plate 60 may be below the digitizer 50. The digitizer 50 may be between the second support layer 40 and the plate 60. The plate 60 may transfer heat generated by the digitizer 50 to the outside. Also, the plate 60 may protect the digitizer 50 from external impact. In an embodiment, the plate 60 may include a material having a high heat transfer rate. For example, the plate 60 may include metal or graphite. The thickness of the plate 60 when the plate 60 includes graphite may be relatively less than the thickness of the plate 60 when the plate 60 includes metal. In an embodiment, the plate 60 may include a first plate 60A and a second plate 60B, which are spaced apart from each other with respect to the folding axis FAX.

The cushion layer 70 may be below the plate 60. The plate 60 may be between the digitizer 50 and the cushion layer 70. The cushion layer 70 may prevent or reduce damage to the digitizer 50 due to external impact. In an embodiment, the cushion layer 70 may include a pressure sensitive adhesive.

The waterproof layer 80 may be arranged outside the cushion layer 70. The waterproof layer 80 may block or absorb moisture introduced from the outside of the electronic device 1, thereby preventing or reducing damage to the components of the electronic device 1 due to moisture. In an embodiment, the waterproof layer 80 may include a tape and/or a sponge.

The adhesive layer AL may be between first and second components of the electronic device 1. The adhesive layer AL may adhere the first component and the second component to each other. In an embodiment, the adhesive layer AL may include a pressure sensitive adhesive. In another embodiment, the adhesive layer AL may include an optically clear adhesive. The adhesive layer AL may include a first adhesive layer AL1, a second adhesive layer AL2, a third adhesive layer AL3, a fourth adhesive layer AL4, a fifth adhesive layer AL5, a sixth adhesive layer AL6, and a seventh adhesive layer AL7.

The first adhesive layer AL1 may be between the first protective layer PB1 and the cover window 20. The first adhesive layer AL1 may adhere the first protective layer PB1 and the cover window 20 to each other. The second adhesive layer AL2 may be between the first protective layer PB1 and the display panel 10. The second adhesive layer AL2 may adhere the first protective layer PB1 and the display panel 10 to each other. The third adhesive layer AL3 may be between the display panel 10 and the second protective layer PB2. The third adhesive layer AL3 may adhere the display panel 10 and the second protective layer PB2 to each other. The fourth adhesive layer AL4 may be between the second protective layer PB2 and the first support layer 30. The fourth adhesive layer AL4 may adhere the second protective layer PB2 and the first support layer 30 to each other. The fifth adhesive layer AL5 may be between the first support layer 30 and the second support layer 40. The fifth adhesive layer AL5 may adhere the first support layer 30 and the second support layer 40 to each other. In an embodiment, the fifth adhesive layer AL5 may not overlap the folding pattern 40P in a plan view. The sixth adhesive layer AL6 may be between the second support layer 40 and the digitizer 50. The sixth adhesive layer AL6 may adhere the second support layer 40 and the digitizer 50 to each other. In an embodiment, the sixth adhesive layer AL6 may prevent or reduce infiltration of foreign matter into the folding pattern 40P of the second support layer 40. The seventh adhesive layer AL7 may be between the digitizer 50 and the plate 60. The seventh adhesive layer AL7 may adhere the digitizer 50 and the plate 60 to each other. In an embodiment, the seventh adhesive layer AL7 may include a first portion and a second portion, which are spaced apart from each other with respect to the folding axis FAX.

The fourth adhesive layer AL4, the first support layer 30, the fifth adhesive layer AL5, the second support layer 40, the sixth adhesive layer AL6, the digitizer 50, the seventh adhesive layer AL7, the plate 60, and the cushion layer 70 may each define a through-hole overlapping the component area CA therein. In this case, the acoustic transmittance and/or the light transmittance reaching the component COMP from the outside may increase. In another embodiment, at least one of the fourth adhesive layer AL4, the first support layer 30, the fifth adhesive layer AL5, the second support layer 40, the sixth adhesive layer AL6, the digitizer 50, the seventh adhesive layer AL7, the plate 60, and the cushion layer 70 may not define a through-hole overlapping the component area CA in a plan view. In an embodiment, the second protective layer PB2 may be continuously arranged in the main area MA and the component area CA. In this case, the second protective layer PB2 may protect the display panel 10. In another embodiment, the second protective layer PB2 may define a through-hole overlapping the component area CA therein.

The component COMP may be between the housing HS and the display panel 10. In an embodiment, the component COMP may be attached to housing HS. In another embodiment, the component COMP may be arranged in the accommodation space AS. The component COMP may include an electronic module. For example, the electronic module may include a sensor (e.g., an infrared sensor) using light, a camera configured to receive light to capture an image, a sensor configured to measure a distance or recognize a fingerprint or the like by outputting and sensing light or sound, a small lamp configured to output light, and/or a speaker configured to output sound. The electronic module using light may use light of various wavelength bands such as visible light, infrared light, and/or ultraviolet light.

In an embodiment, the component COMP may include a light-emitting module and a light-receiving module. The light-emitting module and the light-receiving module may have an integrated structure, or a pair of the light-emitting module and the light-receiving module may constitute one component COMP in a physically separated structure.

Figure 5:
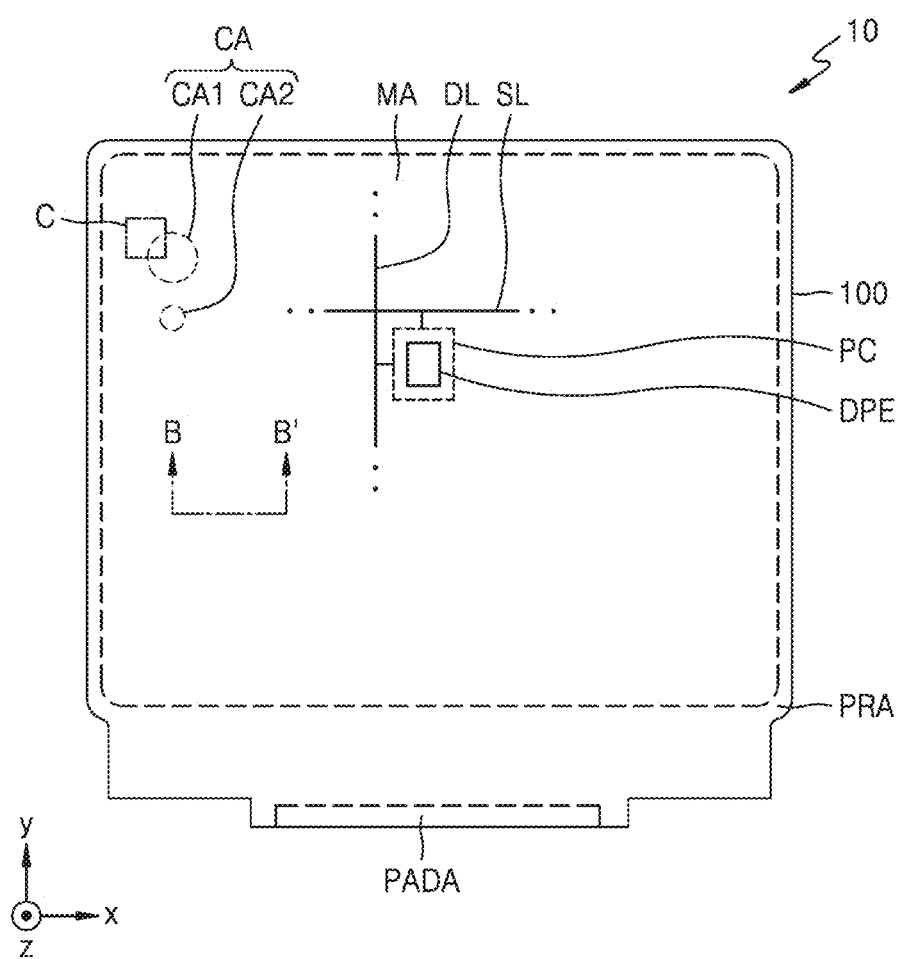
FIG. 5 is a schematic plan view of a display panel according to an embodiment.
Figure 6:
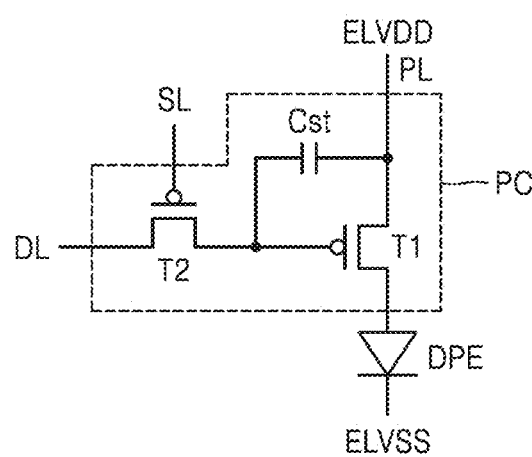
FIG. 6 is an equivalent circuit diagram schematically illustrating a pixel circuit of a display panel and a display element connected to the pixel circuit.

FIG. 5 is a schematic plan view of a display panel 10 according to an embodiment. FIG. 6 is an equivalent circuit diagram schematically illustrating a pixel circuit PC of a display panel and a display element DPE connected to the pixel circuit PC.

Referring to FIGS. 5 and 6, the display panel 10 may include a main area MA, a component area CA, and a peripheral area PRA. The display panel 10 may include a substrate 100, a pixel circuit PC, a scan line SL, a data line DL, a driving voltage line PL, and a display element DPE. In an embodiment, the main area MA, the component area CA, and the peripheral area PRA may be defined in the substrate 100. In other words, the substrate 100 may include the main area MA, the component area CA, and the peripheral area PRA. Hereinafter, a case in which the substrate 100 includes the main area MA, the component area CA, and the peripheral area PRA will be described in detail.

The pixel circuit PC and the display element DPE may overlap at least one of the main area MA and the component area CA in a plan view. The pixel circuit PC may include a driving thin-film transistor T1, a switching thin-film transistor T2, and a storage capacitor Cst. The display element may emit red light, green light, or blue light, or may emit red light, green light, blue light, or white light.

The switching thin-film transistor T2 may be connected to the scan line SL and the data line DL and may be configured to transmit, to the driving thin-film transistor T1, a data voltage or a data signal input from the data line DL in response to a scan voltage or a scan signal input from the scan line SL.

The storage capacitor Cst may be connected to the switching thin-film transistor T2 and the driving voltage line PL and may be configured to store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst and may be configured to control a driving current flowing from the driving voltage line PL to the display element DPE in response to a voltage value stored in the storage capacitor Cst. The display element DPE may emit light having a certain luminance according to the driving current. An opposite electrode (e.g., a cathode) of the display element DPE may be configured to receive a second power supply voltage ELVSS.

Although FIG. 6 illustrates that the pixel circuit PC includes two thin-film transistors and one storage capacitor, the pixel circuit PC may include three or more thin-film transistors.

At least a portion of the component area CA may be surrounded by the main area MA. In an embodiment, the component area CA may be completely surrounded by the main area MA. The component area CA may include a pixel area in which the display element DPE is arranged and a transmission area in which the display element DPE is not arranged. Therefore, the light transmittance of the display panel 10 in the component area CA may be higher than the light transmittance of the display panel 10 in the main area MA. In an embodiment, the component area CA may include a first component area CA1 and a second component area CA2.

The peripheral area PRA may be arranged outside the main area MA. In an embodiment, the peripheral area PRA may surround the main area MA. A scan driver (not illustrated) configured to provide the scan signal to the pixel circuit PC, a data driver (not illustrated) configured to provides the data signal, and a power line (not illustrated) configured to provide the first power supply voltage ELVDD and/or the second power supply voltage ELVSS may be arranged in the peripheral area PRA. The peripheral area PRA may include a pad area PADA. A pad (not illustrated) may be arranged in the pad area PADA, and a display circuit board may be connected to the pad.

Figure 7:
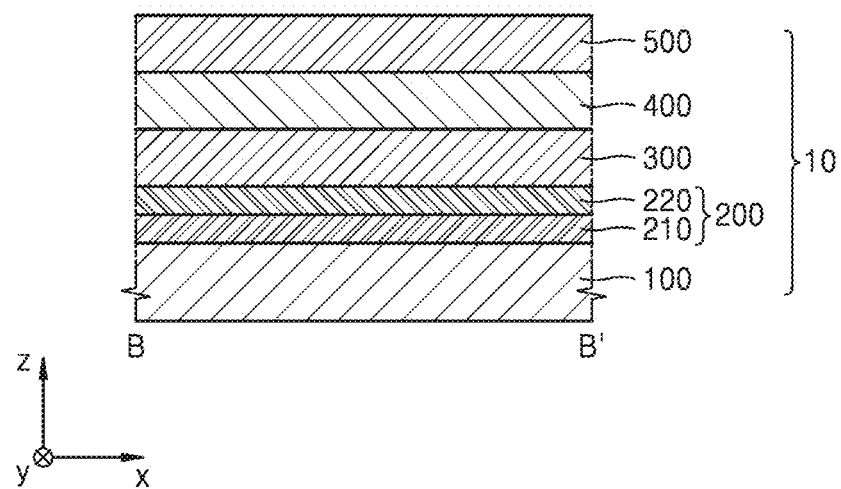
FIG. 7 is a schematic cross-sectional view of the display panel taken along line B-B' of FIG. 5.

FIG. 7 is a schematic cross-sectional view of the display panel 10 taken along line B-B' of FIG. 5.

Referring to FIG. 7, the display panel 10 may include a substrate 100, a display layer 200, an encapsulation layer 300, a touch sensor layer 400, and an anti-reflective layer 500. The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate. In an embodiment, the substrate 100 may have a multilayer structure including a barrier layer (not illustrated) and a base layer including the above-described polymer resin. The substrate 100 including the polymer resin may be flexible, rollable, or bendable.

The display layer 200 may be on the substrate 100. The display layer 200 may include a pixel circuit layer 210 and a display element layer 220. The pixel circuit layer 210 may include pixel circuits. The display element layer 220 may include a plurality of display elements connected to a plurality of pixel circuits, respectively. The pixel circuit layer 210 may include a plurality of thin-film transistors and a plurality of storage capacitors.

The encapsulation layer 300 may be on the display layer 200. In an embodiment, the encapsulation layer 300 may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include an acrylic resin, an epoxy-based resin, polyimide, polyethylene, and the like. In an embodiment, the at least one organic encapsulation layer may include acrylate.

In another embodiment, the encapsulation layer 300 may have a structure in which the substrate 100 and an upper substrate, which is a transparent member, are coupled to each other by a sealing member so that an inner space between the substrate 100 and the upper substrate is sealed. In this case, a moisture absorbent or a filler may be positioned in the inner space. The sealing member may include a sealant. In another embodiment, the sealing member may include a material that is cured by a laser. For example, the sealing member may include a frit. Specifically, the sealing member may include an organic sealant such as a urethane-based resin, an epoxy-based resin, and/or an acrylic resin, or may include an inorganic sealant such as silicone. Examples of the urethane resin may include urethane acrylate. Examples of the acrylic resin may include butyl acrylate and ethylhexyl acrylate. On the other hand, the sealing member may include a material that is cured by heat.

The touch sensor layer 400 may be on the encapsulation layer 300. The touch sensor layer 400 is a layer configured to sense a touch input of a user. The touch sensor layer 400 may sense the touch input of the user by using at least one of various touch methods such as a resistive method and a capacitive method. The touch sensor layer 400 may include sensing electrodes so as to sense a touch input.

The anti-reflective layer 500 may be on the touch sensor layer 400. The anti-reflective layer 500 may reduce the reflectance of light (external light) incident from the outside toward the display panel 10. In an embodiment, the anti-reflective layer 500 may include a black matrix and/or color filters. The color filters may be arranged considering the color of light emitted from the display elements of the display panel 10. For example, the anti-reflective layer 500 may include a red, green, or blue color filter.

In another embodiment, the anti-reflective layer 500 may be provided as a polarizing film. The polarizing film may include a linear polarizer and a retardation film such as a quarter-wave ($\lambda/4$) plate. The retardation film may be on the touch sensor layer 400, and the linear polarizer may be on the retardation film.

Figure 8:
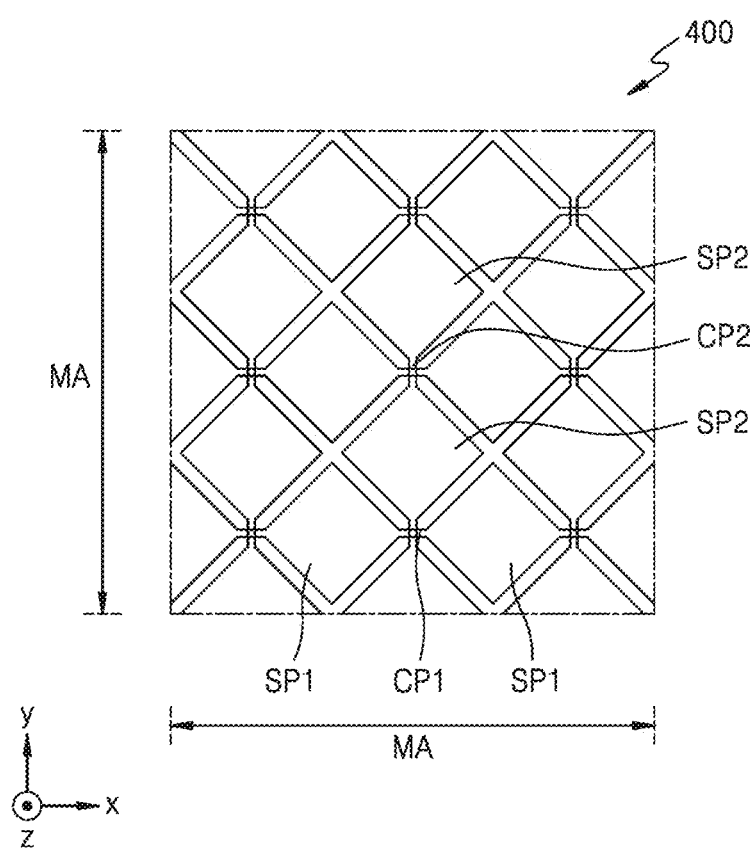
FIG. 8 is a plan view schematically illustrating a portion of a touch sensor layer, according to an embodiment.

FIG. 8 is a plan view schematically illustrating a portion of the touch sensor layer 400, according to an embodiment.

Referring to FIG. 8, the touch sensor layer 400 may include a plurality of first sensing electrodes SP1 arranged in the first direction (e.g., x direction or −x direction), and a plurality of second sensing electrodes SP2 arranged in the second direction (e.g., y direction or −y direction).

The adjacent first sensing electrodes SP1 may be electrically connected to each other through a first connection electrode CP1. The adjacent second sensing electrodes SP2 may be electrically connected to each other through a second connection electrode CP2.

The first sensing electrodes SP1 and the second sensing electrodes SP2 may include a conductive layer, and the conductive layer may include a metal layer and/or a transparent conductive layer. The metal layer may include molybdenum (Mo), silver (Ag), titanium (Ti), copper (Cu), aluminum (Al), and/or any alloy thereof. The transparent conductive layer may include a transparent conductive oxide such as indium tin oxide ("ITO"), indium zinc oxide ("IZO"), zinc oxide (ZnO), and/or indium tin zinc oxide ("ITZO"). In addition, the transparent conductive layer may include a conductive polymer such as poly(3,4-ethylenedioxythiophene) ("PEDOT"), metal nanowires, carbon nanotubes, and/or graphene. Each of the first connection electrodes CP1 and the second connection electrodes CP2 may also include a conductive layer such as a metal layer and/or a transparent conductive layer, as described above.

Figure 9:
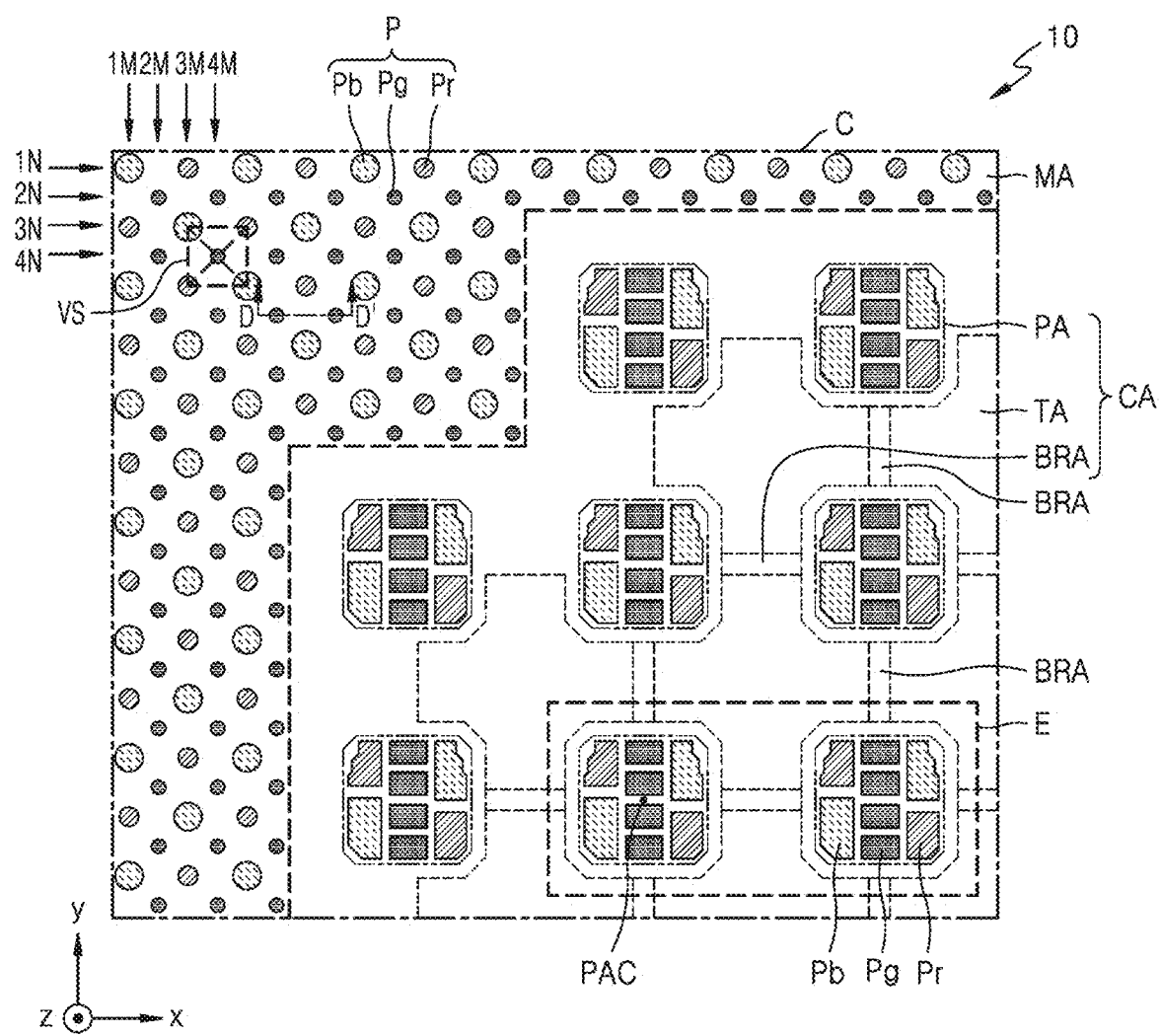
FIG. 9 is an enlarged view of region C in the display panel of FIG. 5.

FIG. 9 is an enlarged view of region C in the display panel 10 of FIG. 5.

Referring to FIG. 9, the display panel 10 may include a substrate 100 and a display element. The substrate 100 may include a component area CA and a main area MA. In an embodiment, the component area CA may include a pixel area PA, a transmission area TA, and a bridge area BRA.

A plurality of pixel areas PA may be provided. In an embodiment, the plurality of pixel areas PA may be arranged in the first direction (e.g., x direction or −x direction) and/or the second direction (e.g., y direction or −y direction). The plurality of pixel areas PA may be spaced apart from each other in the first direction (e.g., x direction or −x direction) and/or the second direction (e.g., y direction or −y direction).

The display element may be arranged in the pixel area PA. In an embodiment, a sub-pixel P implemented as the display element may be arranged in the pixel area PA. In the present specification, the sub-pixel P is a minimum unit for implementing an image and refers to an emission area of the display element. A plurality of sub-pixels P may be arranged in the pixel area PA. In an embodiment, the plurality of sub-pixels P may include a red sub-pixel Pr, a green sub-pixel Pg, and a blue sub-pixel Pb.

Two red sub-pixels Pr, four green sub-pixels Pg, and two blue sub-pixels Pb may be provided in one pixel area PA. In an embodiment, in the pixel area PA, the four green sub-pixels Pg may be spaced apart from each other by a certain interval in the second direction (e.g., y direction or −y direction). In the pixel area PA, one red sub-pixel Pr and one blue sub-pixel Pb may be arranged at one side of the four green sub-pixels Pg. In the pixel area PA, the red sub-pixel Pr and the blue sub-pixel Pb may be spaced apart from each other by a certain interval in the second direction (e.g., y direction or −y direction). In an embodiment, the two red sub-pixels Pr may be arranged opposite to each other with respect to a center PAC of the pixel area PA. In an embodiment, the two blue sub-pixels Pb may be arranged opposite to each other with respect to the center PAC of the pixel area PA.

In an embodiment, the length of the blue sub-pixel Pb in the second direction (e.g., y direction or −y direction) in the pixel area PA may be greater than the length of the red sub-pixel Pr in the second direction (e.g., y direction or −y direction) in the pixel area PA. In an embodiment, the length of the blue sub-pixel Pb in the second direction (e.g., y direction or −y direction) in the pixel area PA may be equal to or greater than the sum of the lengths of the two green sub-pixels Pg in the second direction (e.g., y direction or −y direction) in the pixel area PA.

One sub-pixel P in the pixel area PA may have a rectangular shape in a plan view, and another sub-pixel P in the pixel area PA may have a pentagonal shape in a plan view. For example, the green sub-pixel Pg in the pixel area PA may have a rectangular shape with a long side and a short side, and the red sub-pixel Pr and/or the blue sub-pixel Pb in the pixel area PA may have a pentagonal shape in a plan view. In this case, the red sub-pixel Pr and/or the blue sub-pixel Pb in the pixel area PA may have a side inclined with respect to both the first direction (e.g., x direction or −x direction) and the second direction (e.g., y direction or −y direction). The side may be arranged to face the transmission area TA. As another example, some sub-pixels P in the pixel area PA may have an n-polygonal shape (n is an integer equal to or greater than 6) in a plan view. In this case, the area of the pixel area PA in the component area CA may decrease and the area of the transmission area TA may increase. Therefore, the light transmittance of the display panel 10 in the component area CA may increase.

The transmission area TA may be adjacent to the pixel area PA. In an embodiment, the transmission area TA may be between the plurality of pixel areas PA. The transmission area TA may be an area in the component areas CA other than the pixel area PA and the bridge area BRA. The display element may not be arranged in the transmission area TA. Therefore, the light transmittance of the display panel 10 in the transmission area TA may be higher than the light transmittance of the display panel 10 in the pixel area PA.

A plurality of transmission areas TA may be provided. The plurality of transmission areas TA may be arranged in the first direction (e.g., x direction or −x direction) and/or the second direction (e.g., y direction or −y direction). Although FIG. 9 illustrates that the transmission area TA has a cross shape in a plan view, the shape of the transmission area TA in a plan view may be variously changed.

The bridge area BRA may be between the adjacent pixel areas PA. The bridge area BRA may extend between the adjacent pixel areas PA. Lines may be arranged in the bridge area BRA.

The main area MA may surround at least a portion of the component area CA. In an embodiment, the main area MA may completely surround the component area CA. In an embodiment, the main area MA and the component area CA may have a bent boundary. In the main area MA, the red sub-pixel Pr, the green sub-pixel Pg, and the blue sub-pixel Pb may be arranged in a PENTILE™ structure.

A plurality of blue sub-pixels Pb and a plurality of red sub-pixels Pr may be alternately arranged in a first row 1N of the main area MA. A plurality of green sub-pixels Pg may be spaced apart from each other by a certain interval in a second row 2N adjacent to the first row 1N. A plurality of red sub-pixels Pr and a plurality of blue sub-pixels Pb may be alternately arranged in a third row 3N adjacent to the second row 2N. A plurality of green sub-pixels Pg may be spaced apart from each other by a certain interval in a fourth row 4N adjacent to the third row 3N. Such a sub-pixel arrangement may be repeated up to an N-th row in the main area MA. In an embodiment, each of the red sub-pixel Pr and the blue sub-pixel Pb may be larger than the green sub-pixel Pg in the main area MA.

The plurality of blue sub-pixels Pb and the plurality of red sub-pixels Pr arranged in the first row 1N of the main area MA may be misaligned with the plurality of green sub-pixels Pg arranged in the second row 2N in a view from the second direction. Therefore, a plurality of blue sub-pixels Pb and a plurality of red sub-pixels Pr may be alternately arranged in a first column 1M. A plurality of green sub-pixels Pg may be spaced apart from each other by a certain interval in a second column 2M adjacent to the first column 1M. A plurality of red sub-pixels Pr and a plurality of blue sub-pixels Pb may be alternately arranged in a third column 3M adjacent to the second column 2M. A plurality of green sub-pixels Pg may be spaced apart from each other by a certain interval in a fourth column 4M adjacent to the third column 3M. Such a sub-pixel arrangement may be repeated up to an M-th column.

Such a sub-pixel arrangement structure may be expressed differently as follows: the green sub-pixel Pg in the main area MA is arranged at a center of a virtual quadrangle VS as shown in FIG. 9. In an embodiment, the center point of the green sub-pixel Pg may be the center point of the virtual quadrangle VS. The red sub-pixel Pr and the blue sub-pixel Pb may be arranged at vertices of the virtual quadrangle VS, respectively. In an embodiment, the red sub-pixels Pr may be arranged at first and third vertices facing each other among the vertices of the virtual quadrangle VS, respectively. The blue sub-pixels Pb may be arranged at second and fourth vertices facing each other among the vertices of the virtual quadrangle VS, respectively. The virtual quadrangle VS may be variously modified into, for example, a rectangle, a rhombus, a square, and the like.

Such a sub-pixel arrangement structure is referred to as a PENTILE™ matrix structure or a PENTILE™ structure. By applying rendering for expressing colors while sharing adjacent sub-pixels, high resolution may be implemented with a small number of sub-pixels.

FIG. 9 illustrates that the red sub-pixel Pr, the green sub-pixel Pg, and the blue sub-pixel Pb in the main area MA each have a circular shape, but in another embodiment, the red sub-pixel Pr, the green sub-pixel Pg, and the blue sub-pixel Pb in the main area MA each may have a polygonal shape or an elliptical shape.

In an embodiment, the size of the red sub-pixel Pr in the pixel area PA may be greater than the size of the red sub-pixel Pr in the main area MA. The size of the green sub-pixel Pg in the pixel area PA may be greater than the size of the green sub-pixel Pg in the main area MA. The size of the blue sub-pixel Pb in the pixel area PA may be greater than the size of the blue sub-pixel Pb in the main area MA. Therefore, the lifespan of the display element in the pixel area PA may increase.

Figure 10:
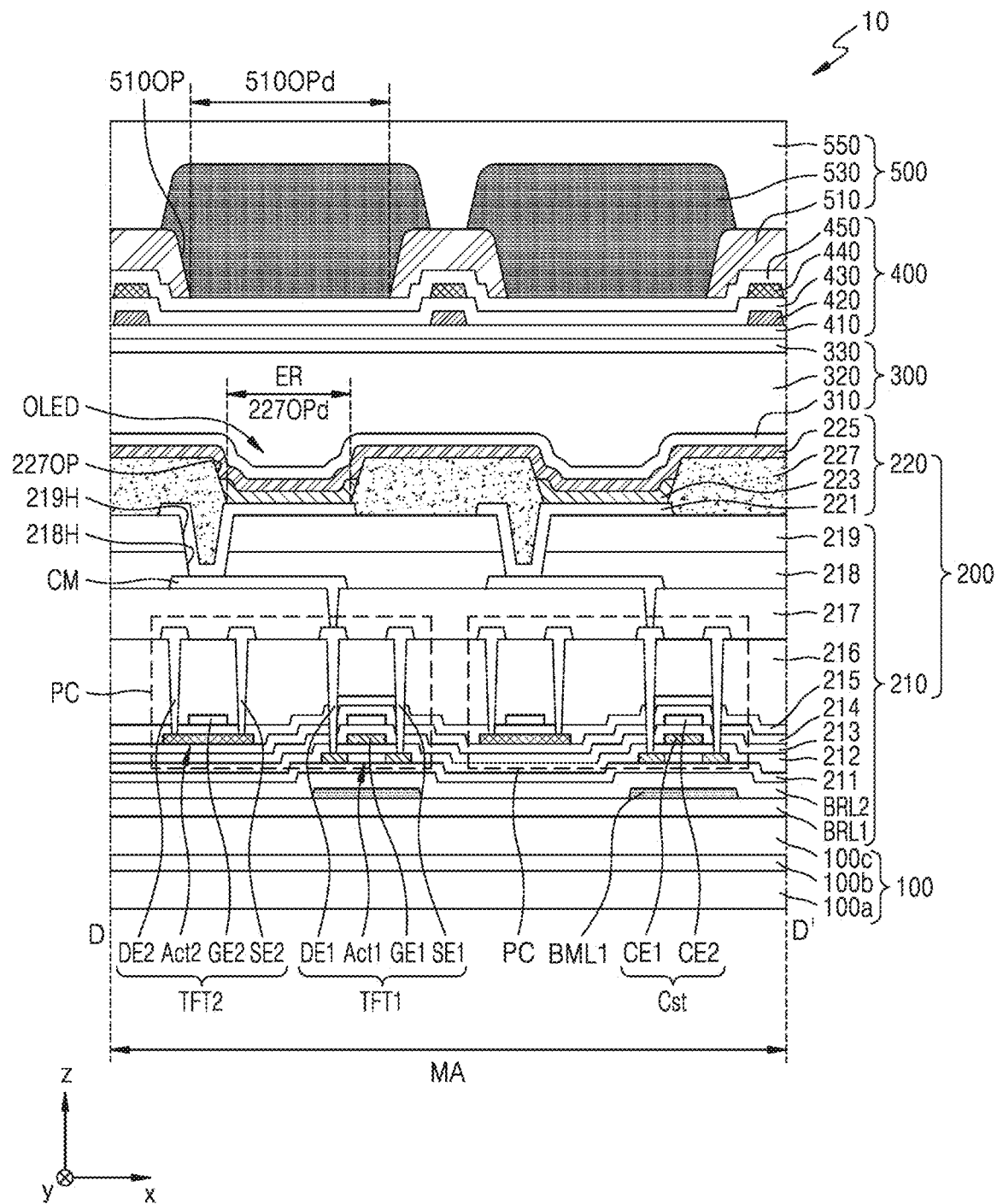
FIG. 10 is a schematic cross-sectional view of the display panel taken along line D-D' of FIG. 9.

FIG. 10 is a schematic cross-sectional view of the display panel 10 taken along line D-D' of FIG. 9.

Referring to FIG. 10, the display panel 10 may include a substrate 100, a display layer 200, an encapsulation layer 300, a touch sensor layer 400, and an anti-reflective layer 500. The substrate 100 may include a main area MA and a component area CA. The substrate 100 may include a first organic layer 100a, an inorganic layer 100b, and a second organic layer 100c, which are sequentially stacked.

At least one of the first organic layer 100a and the second organic layer 100c may a polymer resin such as polyethersulfone, polyarylate, polyetherimide, polyethylene naphthalate, polyethylene terephthalate, polyphenylene sulfide, polyimide, polycarbonate, cellulose triacetate, and/or cellulose acetate propionate.

The inorganic layer 100b may include an inorganic material such as silicon nitride ($SiN_x$), silicon oxynitride (SiON), and/or silicon oxide ($SiO_2$). In some embodiments, the inorganic layer 100b may include amorphous silicon (a-Si). In an embodiment, the inorganic layer 100b may include a single layer or multiple layers including the above-described material.

The display layer 200 may be on the substrate 100. The display layer 200 may include a pixel circuit layer 210 and a display element layer 220. The pixel circuit layer 210 may include a first barrier layer BRL1, a first metal layer BML1, a second barrier layer BRL2, a pixel circuit PC, a connection electrode CM, and a plurality of insulating layers. The pixel circuit PC may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a first electrode CE1 and a second electrode CE2. The insulating layers may include a buffer layer 211, a first inorganic insulating layer 212, a gate insulating layer 213, an intermediate insulating layer 214, a second inorganic insulating layer 215, an interlayer-insulating layer 216, a first organic insulating layer 217, a second organic insulating layer 218, and a third organic insulating layer 219.

The first barrier layer BRL1 may be on the substrate 100. The first barrier layer BRL1 may include an inorganic material such as silicon nitride ($SiN_x$), silicon oxynitride (SiON), and/or silicon oxide ($SiO_2$). In some embodiments, the first barrier layer BRL1 may include amorphous silicon (a-Si). In an embodiment, the first barrier layer BRL1 may include a single layer or multiple layers including the above-described material.

The first metal layer BML1 may be on the first barrier layer BRL1. The first metal layer BML1 may overlap the first thin-film transistor TFT1 in a plan view. In an embodiment, the first metal layer BML1 may not overlap the second thin-film transistor TFT2 in a plan view. The first metal layer BML1 may prevent or reduce the influence of electrical potential on the pixel circuit PC due to the polarization of the first organic layer 100a and/or the second organic layer 100c. In some embodiments, a constant voltage or a signal may be applied to the first metal layer BML1. The first metal layer BML1 may allow charges to be more easily supplied to a back channel part of the pixel circuit PC. The first metal layer BML1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). In an embodiment, the first metal layer BML1 may include doped amorphous silicon. The first metal layer BML1 may include a single layer or multiple layers including the above-described material.

The second barrier layer BRL2 may be on the first barrier layer BRL2. The second barrier layer BRL2 may include an inorganic material such as silicon nitride ($SiN_x$), silicon oxynitride (SiON), and/or silicon oxide ($SiO_2$). In some embodiments, the second barrier layer BRL2 may include amorphous silicon (a-Si). In an embodiment, the second barrier layer BRL2 may include a single layer or multiple layers including the above-described material.

The buffer layer 211 may be on the second barrier layer BRL2. The buffer layer 211 may include an inorganic material such as silicon nitride ($SiN_x$), silicon oxynitride (SiON), and/or silicon oxide ($SiO_2$), and may include a single layer or multiple layers including the above-described inorganic material.

The first semiconductor layer Act1 may be on the buffer layer 211. The first semiconductor layer Act1 may include a silicon semiconductor. In an embodiment, the first semiconductor layer Act1 may include polysilicon. The first semiconductor layer Act1 may include a channel region, and a drain region and a source region on opposite sides of the channel region. In another embodiment, the first semiconductor layer Act1 may include an organic semiconductor or an oxide semiconductor.

The first inorganic insulating layer 212 may be on the first semiconductor layer Act1. The first inorganic insulating layer 212 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The first gate electrode GE1 may be on the first inorganic insulating layer 212. The first gate electrode GE1 may overlap the first semiconductor layer Act1 in a plan view. The first gate electrode GE1 may include a low resistance metal material. The first gate electrode GE1 may include a conductive material including molybdenum (Mo), aluminum (Al), copper (Cu), titanium (Ti), and the like, and may include a single layer or multiple layers including the above-described material.

The gate insulating layer 213 may be on the first gate electrode GE1. The gate insulating layer 213 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second electrode CE2 may be on the gate insulating layer 213. In an embodiment, the second electrode CE2 may overlap the first gate electrode GE1 in a plan view. The second electrode CE2 and the first gate electrode GE1 may overlap each other with the gate insulating layer 213 therebetween and may constitute the storage capacitor Cst. That is, the first gate electrode GE1 may function as the first electrode CE1 of the storage capacitor Cst. As such, the storage capacitor Cst may overlap the first thin-film transistor TFT1 in a plan view. In another embodiment, the storage capacitor Cst may not overlap the first thin-film transistor TFT1 in a plan view. The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The intermediate insulating layer 214 may be on the second electrode CE2. The interlayer-insulating layer 214 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second semiconductor layer Act2 may be on the intermediate insulating layer 214. In an embodiment, the second semiconductor layer Act2 may be on the first inorganic insulating layer 212. The second semiconductor layer Act2 may include a channel region, and a source region and a drain region on opposite sides of the channel region. The second semiconductor layer Act2 may include an oxide semiconductor. For example, the second semiconductor layer Act2 may include a Zn oxide-based material such as Zn oxide, and/or In—Zn oxide, Ga—In—Zn oxide. Alternatively, the second semiconductor layer Act2 may include In—Ga—Zn—O ("IGZO"), In—Sn—Zn—O (ITZO), and/or In—Ga—Sn—Zn—O ("IGTZO") semiconductor, in which a metal such as indium (In), gallium (Ga), and/or tin (Sn) is included in ZnO.

The source region and the drain region of the second semiconductor layer Act2 may be formed by making the oxide semiconductor conductive by adjusting the carrier concentration thereof. For example, the source region and the drain region of the second semiconductor layer Act2 may be formed by increasing the carrier concentration through plasma treatment on an oxide semiconductor using hydrogen-based gas, fluorine-based gas, and/or any combination thereof.

The second inorganic insulating layer 215 may be on the second semiconductor layer Act2. The second inorganic insulating layer 215 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate electrode GE2 may be on the second inorganic insulating layer 215. The second gate electrode GE2 may overlap the second semiconductor layer Act2 in a plan view. The second gate electrode GE2 may overlap the channel region of the second semiconductor layer Act2 in a plan view. The second gate electrode GE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The interlayer-insulating layer 216 may be on the second gate electrode GE2. The interlayer-insulating layer 216 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The interlayer-insulating layer 216 may include a single layer or multiple layers including the above-described inorganic insulating material.

The first source electrode SE1 and the first drain electrode DE1 may be on the interlayer-insulating layer 216. The first source electrode SE1 and the first drain electrode DE1 may be connected to the first semiconductor layer Act1. In an embodiment, the first source electrode SE1 and the first drain electrode DE1 may be connected to the first semiconductor layer Act1 through contact holes of the insulating layers. For example, each of the first source electrode SE1 and the first drain electrode DE1 may be connected to the first semiconductor layer Act1 through the contact hole defined in the first inorganic insulating layer 212, the contact hole defined in the gate insulating layer 213, the contact hole defined in the intermediate insulating layer 214, the contact hole defined in the second inorganic insulating layer 215, and the contact hole defined in the interlayer-insulating layer 216. The contact hole defined in the first inorganic insulating layer 212, the contact hole defined in the gate insulating layer 213, the contact hole defined in the intermediate insulating layer 214, the contact hole defined in the second inorganic insulating layer 215, and the contact hole defined in the interlayer-insulating layer 216 may overlap each other in a plan view.

The second source electrode SE2 and the second drain electrode DE2 may be on the interlayer-insulating layer 216. The second source electrode SE2 and the second drain electrode DE2 may be connected to the second semiconductor layer Act2. Each of the second source electrode SE2 and the second drain electrode DE2 may be connected to the second semiconductor layer Act2 through the contact hole defined in the second inorganic insulating layer 215 and the contact hole defined in the interlayer-insulating layer 216.

The first source electrode SE1, the first drain electrode DE1, the second source electrode SE2, and the second drain electrode DE2 may include a material having high conductivity. The first source electrode SE1, the first drain electrode DE1, the second source electrode SE2, and the second drain electrode DE2 may include a conductive material including molybdenum (Mo), aluminum (Al), copper (Cu), titanium (Ti), and the like, and may include a single layer or multiple layers including the above-described material. In an embodiment, the first source electrode SE1, the first drain electrode DE1, the second source electrode SE2, and the second drain electrode DE2 may have a multilayer structure of Ti/Al/Ti.

The first thin-film transistor TFT1 having the first semiconductor layer Act1 including the silicon semiconductor has high reliability. Therefore, a high-quality display panel 10 may be implemented by employing the first thin-film transistor TFT1 as a driving thin-film transistor.

Because the oxide semiconductor has high carrier mobility and low leakage current, the voltage drop may not be great even though the driving time is long. That is, the color change of the image according to the voltage drop is not great even during low-frequency driving, and thus, low-frequency driving is possible. As such, the oxide semiconductor has low leakage current. Thus, by employing the oxide semiconductor in at least one of the thin-film transistors other than the driving thin-film transistor, leakage current may be prevented and power consumption may be reduced. For example, the second thin-film transistor TFT2 may include the second semiconductor layer Act2 including the oxide semiconductor.

The first organic insulating layer 217 may be arranged to cover the first source electrode SE1, the first drain electrode DE1, the second source electrode SE2, and the second drain electrode DE2. The first organic insulating layer 217 may include an organic material. For example, the first organic insulating layer 217 may include an organic insulating material such as a general-purpose polymer (e.g., polymethylmethacrylate ("PMMA") or polystyrene ("PS")), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and/or any blend thereof.

The connection electrode CM may be on the first organic insulating layer 217. The connection electrode CM may be connected to the first drain electrode DE1 or the first source electrode SE1 through the contact hole defined in the first organic insulating layer 217. The connection electrode CM may include a material having high conductivity. The connection electrode CM may include a conductive material including molybdenum (Mo), aluminum (Al), copper (Cu), titanium (Ti), and the like, and may include a single layer or multiple layers including the above-described material. In an embodiment, the connection electrode CM may have a multilayer structure of Ti/Al/Ti.

The second organic insulating layer 218 and the third organic insulating layer 219 may be on the connection electrode CM. The second organic insulating layer 218 and the third organic insulating layer 219 may include an organic material. For example, at least one of the second organic insulating layer 218 and the third organic insulating layer 219 may include an organic insulating material such as a general-purpose polymer (e.g., polymethylmethacrylate (PMMA) or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and/or any blend thereof. Because the second organic insulating layer 218 and the third organic insulating layer 219 are sequentially stacked, the display element layer 220 may be on the flat pixel circuit layer 210. In some embodiments, the third organic insulating layer 219 may be omitted.

The display element layer 220 may be on the pixel circuit layer 210. The display element layer 220 may include a display element, for example, an organic light-emitting diode OLED. A plurality of organic light-emitting diodes OLED may be provided in the main area MA. That is, a plurality of organic light-emitting diodes OLED may be arranged in the main area MA. In an embodiment, each of the organic light-emitting diodes OLED of FIG. 10 may emit light in a green wavelength band. The organic light-emitting diode OLED may include a pixel electrode 221, an emission layer 223, an opposite electrode 225, and a pixel defining layer 227.

The pixel electrode 221 may be on the third organic insulating layer 219. The pixel electrode 221 may be connected to the connection electrode CM through a contact hole 218H defined in the second organic insulating layer 218 and a contact hole 219H of the third organic insulating layer 219. The pixel electrode 221 may include a conductive oxide such as indium tin oxide (ITO), indium zinc oxide (IZO), zinc oxide (ZnO), indium oxide (In$_2$O$_3$), indium gallium oxide ("IGO"), and/or aluminum zinc oxide ("AZO") In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or any compound thereof. In another embodiment, the pixel electrode 221 may further include a layer including ITO, IZO, ZnO, and/or In$_2$O$_3$ above/below the reflective layer.

The pixel defining layer 227 may define an opening 227OP exposing at least a portion of the pixel electrode 221. The opening 227OP of the pixel defining layer 227 may define an emission area ER of the organic light-emitting diode OLED. The emission area ER of the organic light-emitting diode OLED may refer to a sub-pixel. In an embodiment, the pixel defining layer 227 may define a plurality of openings 227OP therein. The plurality of openings 227OP may define a plurality of emission areas ER of the plurality of organic light-emitting diodes OLED.

The pixel defining layer 227 may include an organic insulating material. In another embodiment, the pixel defining layer 227 may include an inorganic insulating material such as silicon nitride (SiN$_x$), silicon oxynitride (SiON), and/or silicon oxide (SiO$_2$). In another embodiment, the pixel defining layer 227 may include an organic insulating material and an inorganic insulating material. In some embodiments, the pixel defining layer 227 may include a light blocking material and may be provided in black. The light blocking material may include carbon black, carbon nanotubes, a resin or a paste including black dye, metal particles, for example, nickel (Ni), aluminum (Al), molybdenum (Mo), and/or any alloy thereof, metal oxide particles (e.g., chromium oxide, etc.), or metal nitride particles (e.g., chromium nitride, etc.). When the pixel defining layer 227 includes a light blocking material, the reflectance of external light due to metal structures under the pixel defining layer 227 may be reduced.

The emission layer 223 may be arranged in the opening 227OP of the pixel defining layer 227. The emission layer 223 may include a high molecular weight organic material or a low molecular weight organic material that emits a certain color. Although not illustrated, a first functional layer and a second functional layer may be below and above the emission layer 223, respectively. The first functional layer may include, for example, a hole transport layer ("HTL"), or may include an HTL and a hole injection layer ("HIL"). The second functional layer may be an optional element that is on the emission layer 223. The second functional layer may include an electron transport layer ("ETL") and/or an electron injection layer ("EIL"). Like the opposite electrode 225 to be described later, the first functional layer and/or the second functional layer may be a common layer covering the entire substrate 100.

The opposite electrode 225 may be on the emission layer 223. The opposite electrode 225 may include a conductive material having a low work function. For example, the opposite electrode 225 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or any alloy thereof. Alternatively, the opposite electrode 225 may further include a layer such as ITO, IZO, ZnO, and/or In$_2$O$_3$ on the (semi)transparent layer including the above-described material. In some embodiments, a capping layer (not illustrated) may be further on the opposite electrode 225. The capping layer may include LiF, an inorganic material, and/or an organic material.

The encapsulation layer 300 may be on the display element layer 220. The encapsulation layer 300 may protect the display element layer 220. In an embodiment, the encapsulation layer 300 may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include an acrylic resin, an epoxy-based resin, polyimide, polyethylene, and the like. In an embodiment, the at least one organic encapsulation layer may include acrylate. In an embodiment, the encapsulation layer 300 may include a first inorganic encapsulation layer 310, an organic encapsulation layer 320, and a second inorganic encapsulation layer 330, which are sequentially stacked.

The touch sensor layer 400 may be on the encapsulation layer 300. The touch sensor layer 400 may include a first touch insulating layer 410, a first touch conductive pattern 420, a second touch insulating layer 430, a second touch conductive pattern 440, and a third touch insulating layer 450.

The first touch insulating layer 410 may be on the second inorganic encapsulation layer 330. In an embodiment, the first touch insulating layer 410 may include a single layer or multiple layers including an inorganic material such as silicon nitride ($SiN_x$), silicon oxide ($SiO_2$), and/or silicon nitride (SiON). In some embodiments, the first touch insulating layer 410 may include an organic material. In some embodiments, the first touch insulating layer 410 may be omitted.

The first touch conductive pattern 420 may be on the first touch insulating layer 410 and/or the second inorganic encapsulation layer 330. In an embodiment, the first touch conductive pattern 420 may overlap the pixel defining layer 227 in a plan view. The first touch conductive pattern 420 may not overlap the opening 227OP of the pixel defining layer 227 in a plan view. The first touch conductive pattern 420 may include a conductive material. For example, the first touch conductive pattern 420 may include molybdenum (Mo), aluminum (Al), copper (Cu), titanium (Ti), and the like, and may include a single layer or multiple layers including the above-described material. In an embodiment, the first touch conductive pattern 420 may have a Ti/Al/Ti structure in which a titanium layer, an aluminum layer, and a titanium layer are sequentially stacked.

The second touch insulating layer 430 may cover the first touch conductive pattern 420. The second touch insulating layer 430 may include a single layer or multiple layers including an inorganic material such as silicon nitride ($SiN_x$), silicon oxide ($SiO_2$), and/or silicon nitride (SiON). In some embodiments, the second touch insulating layer 430 may include an organic material.

The second touch conductive pattern 440 may be on the second touch insulating layer 430. In an embodiment, the second touch conductive pattern 440 may overlap the pixel defining layer 227 in a plan view. The second touch conductive pattern 440 may not overlap the opening 227OP defined in the pixel defining layer 227 in a plan view. In an embodiment, the second touch conductive pattern 440 may be connected to the first touch conductive pattern 420 through a contact hole defined in the second touch insulating layer 430. The second touch conductive pattern 440 may include a conductive material. For example, the second touch conductive pattern 440 may include molybdenum (Mo), aluminum (Al), copper (Cu), titanium (Ti), and the like, and may include a single layer or multiple layers including the above-described material. In an embodiment, the second touch conductive pattern 440 may have a Ti/Al/Ti structure in which a titanium layer, an aluminum layer, and a titanium layer are sequentially stacked.

The first touch conductive pattern 420 and the second touch conductive pattern 440 may include a plurality of sensing electrodes configured to sense a touch input. In an embodiment, the first touch conductive pattern 420 and the second touch conductive pattern 440 may include a first sensing electrode (see SP1 of FIG. 5), a second sensing electrode (see SP2 of FIG. 5), a first connection electrode (see CP1 of FIG. 5), and/or a second connection electrode (see CP2 of FIG. 5). In an embodiment, the first sensing electrode SP1 and/or the second sensing electrode SP2 may sense an input by using a mutual capacitance method. In another embodiment, the first sensing electrode SP1 and/or the second sensing electrode SP2 may sense an input by using a self capacitance method.

The third touch insulating layer 450 may cover the second touch conductive pattern 440. In an embodiment, the third touch insulating layer 450 may include a single layer or multiple layers including an inorganic material such as silicon nitride ($SiN_x$), silicon oxide ($SiO_2$), and/or silicon nitride (SiON). In some embodiments, the third touch insulating layer 450 may include an organic material.

The anti-reflective layer 500 may be on the touch sensor layer 400. The anti-reflective layer 500 may include a black matrix 510, a color filter 530, and a planarization layer 550.

The black matrix 510 may be on the third touch insulating layer 450. The black matrix 510 may absorb at least a portion of external light or internally reflected light. The black matrix 510 may include a black pigment. The black matrix 510 may overlap the first touch conductive pattern 420 and/or the second touch conductive pattern 440 in a plan view. Therefore, the reflection of light due to the first touch conductive pattern 420 and/or the second touch conductive pattern 440 may be prevented or reduced.

The black matrix 510 may define an upper opening 510OP overlapping the opening 227OP defined in the pixel defining layer 227 in a plan view. A plurality of upper openings 510OP may be provided in the main area MA. In the main area MA, the plurality of upper openings 510OP may overlap the plurality of openings 227OP, respectively, in a plan view.

The size of the upper opening 510OP may be greater than the size of the opening 227OP of the pixel defining layer 227 in a plan view. The size of the upper opening 510OP may be the planar area of the upper opening 510OP. The size of the opening 227OP of the pixel defining layer 227 may be the planar area of the opening 227OP of the pixel defining layer 227 in a plan view. In an embodiment, a width 510OPd of the upper opening 510OP in the first direction (e.g., x direction or −x direction) may be greater than a width 227OPd of the opening 227OP defined in the pixel defining layer 227. The width 510OPd of the upper opening 510OP may be the shortest distance in the first direction between a portion of the black matrix 510 and the adjacent portion of the black matrix 510, which face each other and define the upper opening 510OP. The width 270OPd of the opening 270OP defined in the pixel defining layer 227 may be the shortest distance in the first direction between a portion of the pixel defining layer 227 and the adjacent portion of the pixel defining layer 227, which face each other and define the opening 270OP. Therefore, light emitted from the organic light-emitting diode OLED may travel at a wide angle.

The color filter 530 may prevent or reduce light reflection from the display panel 10. The color filter 530 may overlap the organic light-emitting diode OLED in a plan view. In an embodiment, the color filter 530 may overlap the upper opening 510OP in a plan view. In an embodiment, a plurality of color filters 530 may be provided. The plurality of color filters 530 may overlap the main area MA. In the main area MA, the color filters 530 may overlap the upper openings 510OP, respectively in a plan view. In an embodiment, adjacent color filters 530 may overlap each other. In another embodiment, the adjacent color filters 530 may not overlap each other.

The color filter 530 may be arranged considering the color of light emitted from the organic light-emitting diode OLED. The color filter 530 may include a red, green, or blue pigment or dye. Alternatively, the color filter 530 may further include, in addition to the pigment or dye, quantum dots. Alternatively, the color filter 530 may not include the pigment or dye and may include scattering particles such as titanium oxide.

The planarization layer 550 may be on the black matrix 510 and the color filter 530. The upper surface of the planarization layer 550 may be flat. In an embodiment, the planarization layer 550 may include an organic material. For example, the planarization layer 550 may include a polymer-based material. The above-described polymer-based material may be transparent. For example, the planarization layer 550 may include a silicone-based resin, an acrylic resin, an epoxy resin, polyimide, or polyethylene.

Figure 11A:
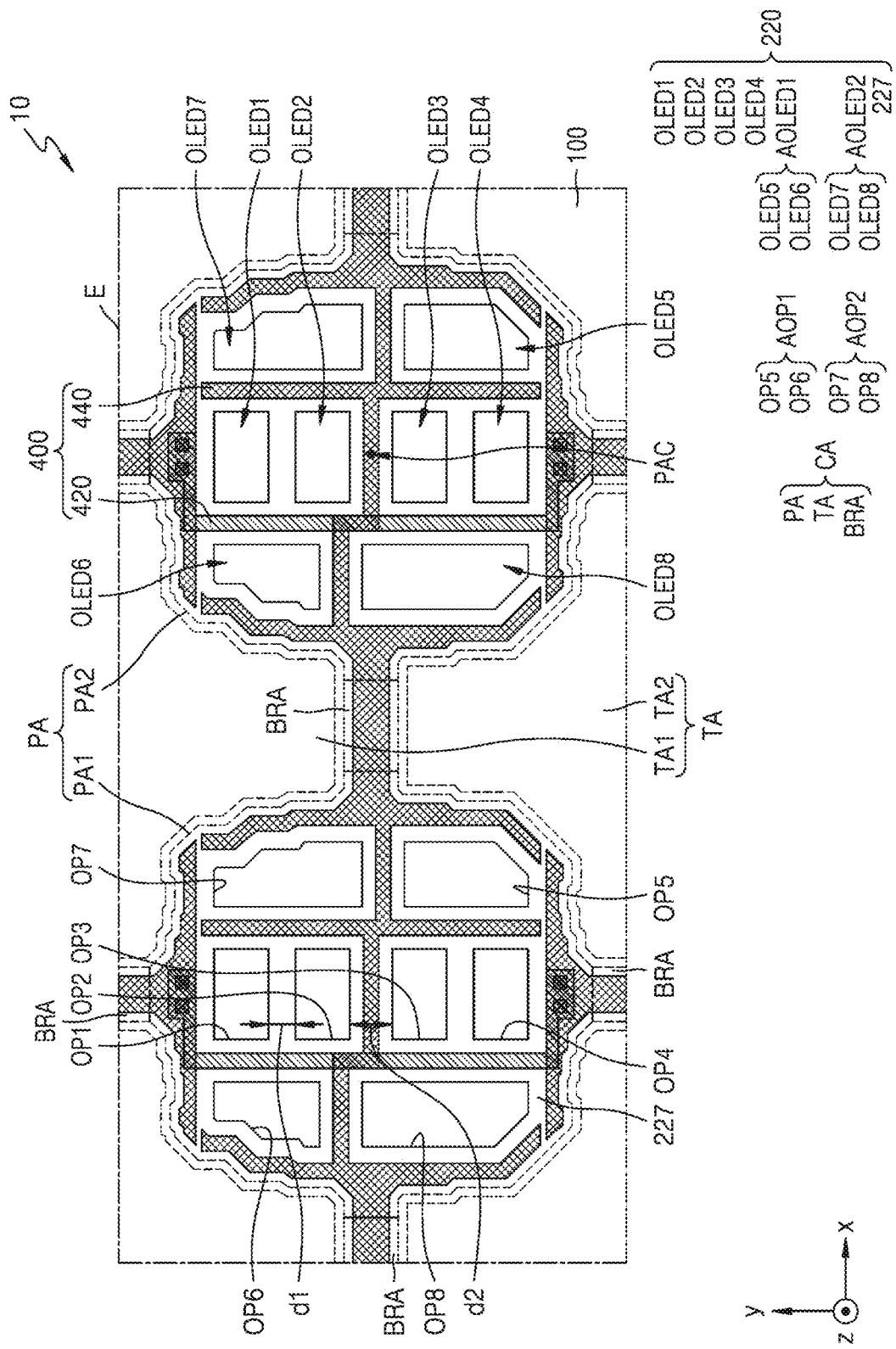
FIGS. 11A and 11B are enlarged views of region E in the display panel of FIG. 9.
Figure 11B:
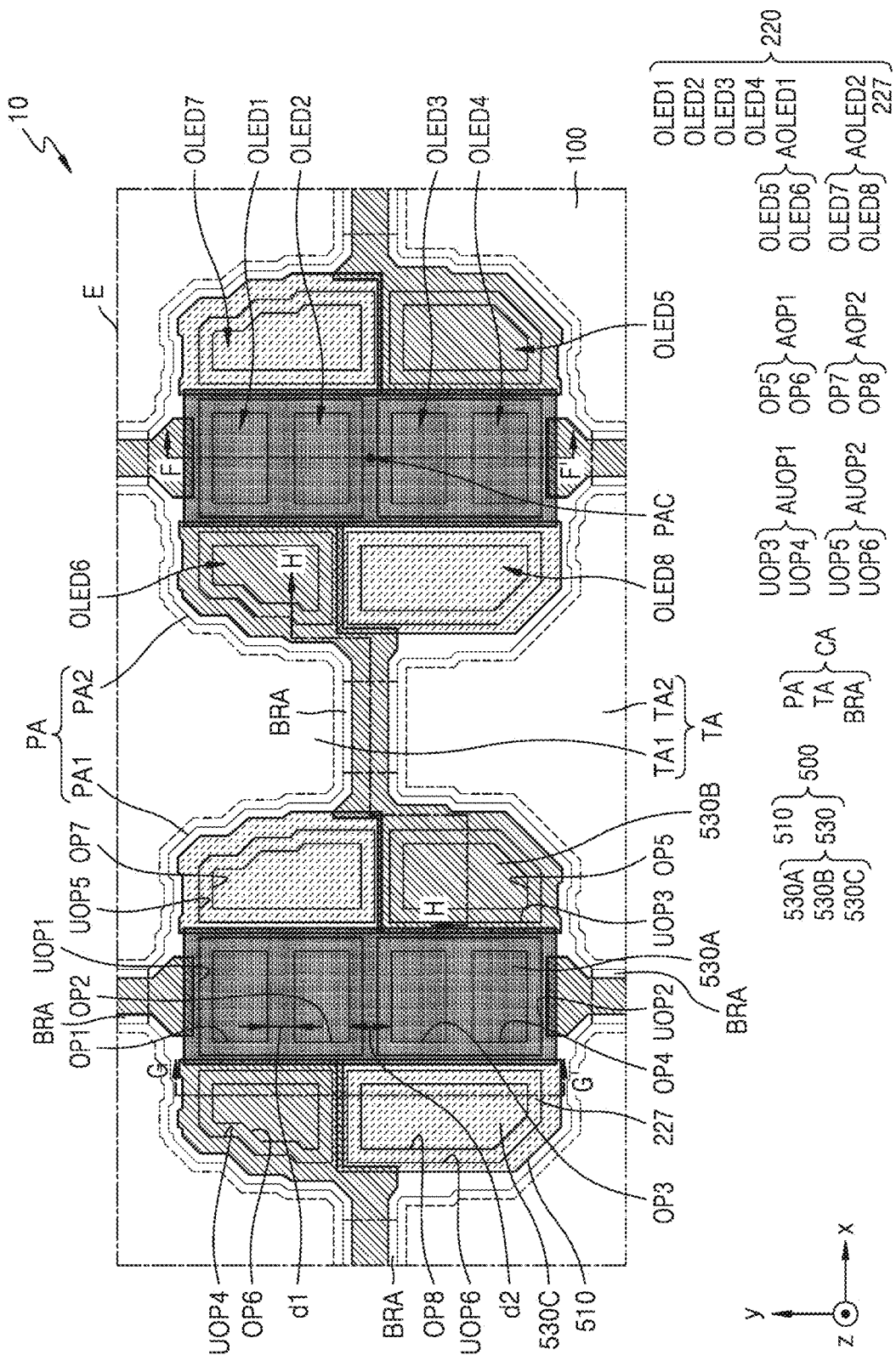

FIGS. 11A and 11B are enlarged views of region E in the display panel 10 of FIG. 9. In FIGS. 11A and 11B, the same reference numerals as those in FIGS. 9 and 10 denote the same members, and redundant descriptions thereof are omitted.

Referring to FIGS. 11A and 11B, the display panel 10 may include a substrate 100, a display element layer 220, a touch sensor layer 400, and an anti-reflective layer 500. The substrate 100 may include a component area CA and a display area. In an embodiment, the component area CA may include a pixel area PA, a transmission area TA, and a bridge area BRA.

A plurality of pixel areas PA may be provided. In an embodiment, the plurality of pixel areas PA may be arranged in the first direction (e.g., x direction or −x direction) and/or the second direction (e.g., y direction or −y direction). The plurality of pixel areas PA may be spaced apart from each other in the first direction (e.g., x direction or −x direction) and/or the second direction (e.g., y direction or −y direction). The pixel area PA may include a first pixel area PA1 and a second pixel area PA2. In an embodiment, the first pixel area PA1 and the second pixel area PA2 may be spaced apart from each other in the first direction (e.g., x direction or −x direction) and/or the second direction (e.g., y direction or −y direction). For example, the first pixel area PA1 and the second pixel area PA2 may be spaced apart from each other in the first direction (e.g., x direction or −x direction).

The transmission area TA may be adjacent to the pixel area PA. In an embodiment, the transmission area TA may be between the plurality of pixel areas PA. The transmission area TA may be an area in the component areas CA other than the pixel area PA and the bridge area BRA. A plurality of transmission areas TA may be provided. The plurality of transmission areas TA may be arranged in the first direction (e.g., x direction or −x direction) and/or the second direction (e.g., y direction or −y direction). The transmission area TA may include a first transmission area TA1 and a second transmission area TA2. The first transmission area TA1 and the second transmission area TA2 may be arranged in the first direction (e.g., x direction or −x direction) and/or the second direction (e.g., y direction or −y direction). For example, the first transmission area TA1 and the second transmission area TA2 may be spaced apart from each other in the second direction (e.g., y direction or −y direction).

The bridge area BRA may be between the adjacent pixel areas PA. The bridge area BRA may extend between the adjacent pixel areas PA. The bridge area BRA may extend between the first pixel area PA1 and the second pixel area PA2. The bridge area BRA may extend between the first transmission area TA1 and the second transmission area TA2. In an embodiment, the bridge area BRA may extend from the first pixel area PA1 to the second pixel area PA2 and be disposed between the first transmission area TA1 and the second transmission area TA2. Lines or wirings may be arranged in the bridge area BRA.

The display element layer 220 may be on the substrate 100. The display element layer 220 may include a display element. In an embodiment, the display element layer 220 may include a first organic light-emitting diode OLED1 as a first display element, a second organic light-emitting diode OLED2 as a second display element, a third organic light-emitting diode OLED3 as a third display element, a fourth organic light-emitting diode OLED4 as a fourth display element, a first adjacent organic light-emitting diode AOLED1 as a first adjacent display element, a second adjacent organic light-emitting diode AOLED2 as a second adjacent display element, and a pixel defining layer 227.

The display element OLED1 to AOLED2 may overlap the pixel area PA. In an embodiment, the first organic light-emitting diode OLED1, the second organic light-emitting diode OLED2, the third organic light-emitting diode OLED3, the fourth organic light-emitting diode OLED4, the first adjacent organic light-emitting diode AOLED1, and the second adjacent organic light-emitting diode AOLED2 may overlap the pixel area PA in a plan view. Each of the plurality of areas PA may overlap the first organic light-emitting diode OLED1, the second organic light-emitting diode OLED2, the third organic light-emitting diode OLED3, the fourth organic light-emitting diode OLED4, the first adjacent organic light-emitting diode AOLED1, and the second adjacent organic light-emitting diode AOLED2 in a plan view. The display element may not overlap the transmission area TA in a plan view.

The first organic light-emitting diode OLED1, the second organic light-emitting diode OLED2, the third organic light-emitting diode OLED3, and the fourth organic light-emitting diode OLED4 may be arranged in the second direction (e.g., y direction or −y direction). In an embodiment, the first organic light-emitting diode OLED1, the second organic light-emitting diode OLED2, the third organic light-emitting diode OLED3, and the fourth organic light-emitting diode OLED4 may emit light of the same color. In an embodiment, the first organic light-emitting diode OLED1, the second organic light-emitting diode OLED2, the third organic light-emitting diode OLED3, and the fourth organic light-emitting diode OLED4 may emit light in a green wavelength band.

One first adjacent organic light-emitting diode AOLED1 and one second adjacent organic light-emitting diode AOLED2 may be arranged at one side of the first organic light-emitting diode OLED1, the second organic light-emitting diode OLED2, the third organic light-emitting diode OLED3, and the fourth organic light-emitting diode OLED4. The first adjacent organic light-emitting diode AOLED1 and the second adjacent organic light-emitting diode AOLED2 may be arranged in the second direction (e.g., y direction or −y direction).

The first adjacent organic light-emitting diode AOLED1 may emit light in a wavelength band different from the wavelength band of the first organic light-emitting diode OLED1. The first adjacent organic light-emitting diode AOLED1 may include a fifth organic light-emitting diode OLED5 and a sixth organic light-emitting diode OLED6. The fifth organic light-emitting diode OLED5 and the sixth organic light-emitting diode OLED6 may be arranged opposite to each other with respect to the center PAC of the pixel area PA. The fifth organic light-emitting diode OLED5 and the sixth organic light-emitting diode OLED6 may emit light of the same color. In an embodiment, the fifth organic light-emitting diode OLED5 and the sixth organic light-emitting diode OLED6 may emit light in a red wavelength band.

The second adjacent organic light-emitting diode AOLED2 may emit light in a wavelength band different from the wavelength bands of the first organic light-emitting diode OLED1 and the first adjacent organic light-emitting diode AOLED1. The second adjacent organic light-emitting diode AOLED2 may include a seventh organic light-emitting diode OLED7 and an eighth organic light-emitting diode OLED8. The seventh organic light-emitting diode OLED7 and the eighth organic light-emitting diode OLED8 may be arranged opposite to each other with respect to the center PAC of the pixel area PA. The seventh organic light-emitting diode OLED7 and the eighth organic light-emitting diode OLED8 may emit light of the same color. In an embodiment, the seventh organic light-emitting diode OLED7 and the eighth organic light-emitting diode OLED8 may emit light in a blue wavelength band.

The pixel defining layer 227 may define a first opening OP1, a second opening OP2, a third opening OP3, a fourth opening OP4, a first adjacent opening AOP1, and a second adjacent opening AOP2. The first opening OP1 may define an emission area of the first organic light-emitting diode OLED1. The second opening OP2 may define an emission area of the second organic light-emitting diode OLED2. The third opening OP3 may define an emission area of the third organic light-emitting diode OLED3. The fourth opening OP4 may define an emission area of the fourth organic light-emitting diode OLED4. The first adjacent opening AOP1 may define an emission area of the first adjacent organic light-emitting diode AOLED1. The first adjacent opening AOP1 may include the fifth opening OP5 and the sixth opening OP6. The fifth opening OP5 may define an emission area of the fifth organic light-emitting diode OLED5. The sixth opening OP6 may define an emission area of the sixth organic light-emitting diode OLED6. The second adjacent opening AOP2 may define an emission area of the second adjacent organic light-emitting diode AOLED2. The second adjacent opening AOP2 may include the seventh opening OP7 and the eighth opening OP8. The seventh opening OP7 may define an emission area of the seventh organic light-emitting diode OLED7. The eighth opening OP8 may define an emission area of the eighth organic light-emitting diode OLED8.

Each of the first opening OP1, the second opening OP2, the third opening OP3, and the fourth opening OP4 may have a rectangular shape in a plan view. Each of the first adjacent opening AOP1 and the second adjacent opening AOP2 may have a polygonal shape in a plan view. Each of the first adjacent opening AOP1 and the second adjacent opening AOP2 may have an n-polygonal shape (n is an integer equal to or greater than 5) in a plan view. In this case, the area of the pixel area PA in the component area CA may decrease and the area of the transmission area TA may increase. Therefore, the light transmittance of the display panel 10 in the component area CA may increase.

A first distance d1 between the first opening OP1 and the second opening OP2 in the second direction (e.g., y direction or −y direction) may be less than a second distance d2 between the second opening OP2 and the third opening OP3 in the second direction. The first distance d1 may be the shortest distance between the first opening OP1 and the second opening OP2 in the second direction (e.g., y direction or −y direction). The second distance d2 may be the shortest distance between the second opening OP2 and the third opening OP3 in the second direction (e.g., y direction or −y direction).

The touch sensor layer 400 may be on the display element layer 220. The touch sensor layer 400 may include a touch conductive pattern. In an embodiment, the touch sensor layer 400 may include a first touch conductive pattern 420 and a second touch conductive pattern 440. At least one of the first touch conductive pattern 420 and the second touch conductive pattern 440 may overlap the pixel area PA and the bridge area BRA in a plan view. The first touch conductive pattern 420 and the second touch conductive pattern 440 may surround at least part of the first opening OP1, the second opening OP2, the third opening OP3, the fourth opening OP4, the first adjacent opening AOP1, and the second adjacent opening AOP2. The first touch conductive pattern 420 and the second touch conductive pattern 440 may not overlap the first opening OP1, the second opening OP2, the third opening OP3, the fourth opening OP4, the first adjacent opening AOP1, and the second adjacent opening AOP2 in a plan view. In other words, the first touch conductive pattern 420 and the second touch conductive pattern 440 may overlap the pixel defining layer 227 in a plan view.

The first touch conductive pattern 420 may extend in the second direction (e.g., y direction or −y direction) in the pixel area PA. The first touch conductive pattern 420 may extend along one side of the first opening OP1, the second opening OP2, the third opening OP3, and the fourth opening OP4. The first touch conductive pattern 420 may not be between the first opening OP1 and the second opening OP2. The first touch conductive pattern 420 may not be between the third opening OP3 and the fourth opening OP4.

The second touch conductive pattern 440 may extend in the first direction (e.g., x direction or −x direction) and/or the second direction (e.g., y direction or −y direction) in the pixel area PA. In an embodiment, the second touch conductive pattern 440 may surround at least part of the first opening OP1 and the second opening OP2. In other words, the second touch conductive pattern 440 may not be between the first opening OP1 and the second opening OP2. In a plan view, the second touch conductive pattern 440 may surround at least part of the first opening OP1, the second opening OP2, and the pixel defining layer 227 between the first opening OP1 and the second opening OP2. The second touch conductive pattern 440 may surround at least part of the third opening OP3 and the fourth opening OP4. In other words, the second touch conductive pattern 440 may not be between the third opening OP3 and the fourth opening OP4. In a plan view, the second touch conductive pattern 440 may surround at least part of the third opening OP3, the fourth opening OP4, and the pixel defining layer 227 between the third opening OP3 and the fourth opening OP4. In a plan view, the second touch conductive pattern 440 may extend between the second opening OP2 and the third opening OP3 in the first direction. In a plan view, the second touch conductive pattern 440 may extend between the first adjacent opening AOP1 and the second adjacent opening AOP2 in the first direction.

The second touch conductive pattern 440 may overlap the bridge area BRA in a plan view. The second touch conductive pattern 440 may extend in the extension direction of the bridge area BRA. For example, in the bridge area BRA, the second touch conductive pattern 440 may extend in the first direction (e.g., x direction or −x direction) and/or the second direction (e.g., y direction or −y direction). In the pixel area PA, the first touch conductive pattern 420 and the second touch conductive pattern 440 may be connected to each other. For example, the first touch conductive pattern 420 and the second touch conductive pattern 440 may be connected to each other outside of the first opening OP1 and outside of the fourth opening OP4. In an embodiment, the plurality of second touch conductive patterns 440 spaced apart from each other in the second direction (e.g., y direction or −y direction) may be connected to each other through the first touch conductive patterns 420. Therefore, the first touch conductive pattern 420 and the second touch conductive pattern 440 may be provided in a mesh shape in the component area CA.

The anti-reflective layer 500 may be on the display element layer 220. In an embodiment, the anti-reflective layer 500 may be on the touch sensor layer 400. That is, the touch sensor layer 400 may be between the display element layer 220 and the anti-reflective layer 500. The anti-reflective layer 500 may include a black matrix 510 and a color filter 530.

The black matrix 510 may overlap the pixel area PA in a plan view. In an embodiment, the black matrix 510 may overlap the pixel area PA and the bridge area BRA in a plan view. Therefore, the reflection of light due to the lines in the pixel area PA and the bridge area BRA may be prevented or reduced. The black matrix 510 may surround at least a portion of the transmission area TA. In other words, the black matrix 510 may not overlap the transmission area TA in a plan view. Alternatively, the black matrix 510 may define a transmission area opening overlapping the transmission area TA therein. Therefore, the light transmittance of the display panel 10 in the transmission area TA may increase.

The black matrix 510 may define a first upper opening UOP1, a second upper opening UOP2, a first adjacent upper opening AUOP1, and a second adjacent upper opening AUOP2. The first upper opening UOP1 may overlap the first opening OP1 and the second opening OP2 in a plan view. In other words, one first upper opening UOP1 may overlap the first opening OP1 and the second opening OP2. In an embodiment, the first upper opening UOP1 may completely overlap both the first opening OP1 and the second opening OP2 in a plan view. Therefore, the black matrix 510 may not be between the first opening OP1 and the second opening OP2. The second upper opening UOP2 may overlap the third opening OP3 and the fourth opening OP4. In other words, one second upper opening UOP2 may overlap the third opening OP3 and the fourth opening OP4. In an embodiment, the second upper opening UOP2 may completely overlap both the third opening OP3 and the fourth opening OP4 in a plan view. Therefore, the black matrix 510 may not be between the third opening OP3 and the fourth opening OP4. When the black matrix 510 is between the first opening OP1 and the second opening OP2 unlike in the present embodiment, light emitted from the first organic light-emitting diode OLED1 and the second organic light-emitting diode OLED2 may travel at a narrow angle. In contrast, in the present embodiment, because the black matrix 510 is disposed not between the first opening OP1 and the second opening OP2 in a plan view, light emitted from the first organic light-emitting diode OLED1 and the second organic light-emitting diode OLED2 may travel at a wide angle. Also, the first touch conductive pattern 420 and the second touch conductive pattern 440 may not be disposed between the first opening OP1 and the second opening OP2 in a plan view. Therefore, even when the black matrix 510 is not between the first opening OP1 and the second opening OP2, the light reflectivity of the display panel 10 may not increase.

The first adjacent upper opening AUOP1 may overlap the first adjacent opening AOP1 in a plan view. The planar area of the first adjacent upper opening AUOP1 may be greater than the planar area of the first adjacent opening AOP1 in a plan view. Therefore, light emitted from the first adjacent organic light-emitting diode AOLED1 may travel at a wide angle. The second adjacent upper opening AUOP2 may overlap the second adjacent opening AOP2 in a plan view. The planar area of the second adjacent upper opening AUOP2 may be greater than the planar area of the second adjacent opening AOP2 in a plan view. Therefore, light emitted from the second adjacent organic light-emitting diode AOLED2 may travel at a wide angle.

The first adjacent upper opening AUOP1 may include a third upper opening UOP3 and a fourth upper opening UOP4. The third upper opening UOP3 may overlap the fifth opening OP5. The fourth upper opening UOP4 may overlap the sixth opening OP6. In other words, a plurality of first adjacent upper openings AUOP1 may overlap a plurality of first adjacent openings AOP1, respectively, in a plan view.

The second adjacent upper opening AUOP2 may include a fifth upper opening UOP5 and a sixth upper opening UOP6. The fifth upper opening UOP5 may overlap the seventh opening OP7. The sixth upper opening UOP6 may overlap the eighth opening OP8. In other words, a plurality of second adjacent upper openings AUOP2 may overlap a plurality of second adjacent openings AOP2, respectively, in a plan view.

The color filter 530 may include a first color filter 530A, a second color filter 530B, and a third color filter 530C. The first color filter 530A may overlap the first organic light-emitting diode OLED1, the second organic light-emitting diode OLED2, the third organic light-emitting diode OLED3, and the fourth organic light-emitting diode OLED4 in a plan view. The second color filter 530B may overlap the first adjacent organic light-emitting diode AOLED1. The third color filter 530C may overlap the second adjacent organic light-emitting diode AOLED2 in a plan view.

The first color filter 530A may overlap the first upper opening UOP1. The first color filter 530A may overlap the second upper opening UOP2. In an embodiment, the first color filter 530A may overlap the first upper opening UOP1 and the second upper opening UOP2. The first color filter 530A may overlap the first opening OP1, the second opening OP2, the third opening OP3, and the fourth opening OP4. In an embodiment, the first color filter 530A may overlap at least a portion of the black matrix 510 in a plan view. In an embodiment, the first color filter 530A may include a green pigment or dye.

The second color filter 530B may overlap the first adjacent upper opening AUOP1. The second color filter 530B may overlap the first adjacent opening AOP1. In an embodiment, the second color filter 530B may overlap at least a portion of the black matrix 510. In an embodiment, the second color filter 530B may overlap at least a portion of the first color filter 530A in a plan view. In an embodiment, the second color filter 530B may include a red pigment or dye.

The second color filter 530B may overlap the bridge area BRA. The second color filter 530B may extend from the first pixel area PA1 to the second pixel area PA2. In an embodiment, the second color filter 530B may extend from the first pixel area PA1 to the second pixel area PA2 and be disposed between the first transmission area TA1 and the second transmission area TA2. In an embodiment, the third upper opening UOP3 overlapping the first pixel area PA1 and the fourth upper opening UOP4 overlapping the second pixel area PA2 may overlap the same second color filter 530B in a plan view. The second color filter 530B may prevent or reduce the reflection of light due to the lines in the bridge area BRA.

The third color filter 530C may overlap the second adjacent upper opening AUOP2. The third color filter 530C may overlap the second adjacent opening AOP2. In an embodiment, the third color filter 530C may overlap at least a portion of the black matrix 510. In an embodiment, the third color filter 530C may overlap at least one of the first color filter 530A and the second color filter 530B in a plan view. In an embodiment, the third color filter 530C may include a blue pigment or dye.

Figure 12:
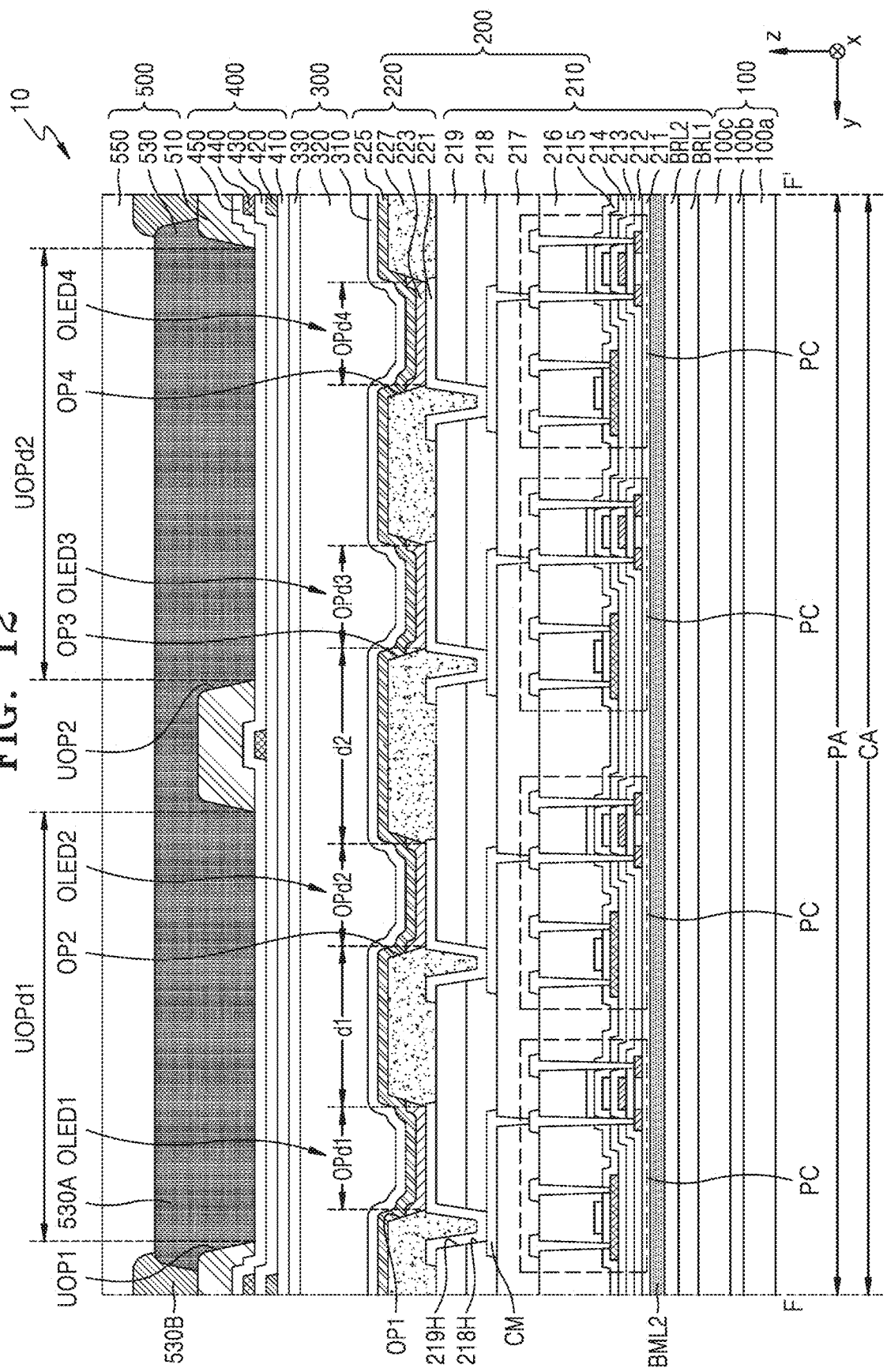
FIG. 12 is a schematic cross-sectional view of the display panel taken along line F-F' of FIG. 11B, according to an embodiment.

FIG. 12 is a schematic cross-sectional view of the display panel 10 taken along line F-F' of FIG. 11B, according to an embodiment. In FIG. 12, the same reference numerals as those in FIGS. 10, 11A, and 11B denote the same members, and redundant descriptions thereof are omitted.

Referring to FIG. 12, the display panel 10 may include a substrate 100, a display layer 200, an encapsulation layer 300, a touch sensor layer 400, and an anti-reflective layer 500. The substrate 100 may include a display area and a component area CA. The component area CA may include a pixel area PA and a transmission area.

The display layer 200 may be on the substrate 100. The display layer 200 may include a pixel circuit layer 210 and a display element layer 220. The pixel circuit layer 210 may include a first barrier layer BRL1, a second barrier layer BRL2, a second metal layer BML2, a pixel circuit PC, a connection electrode CM, and a plurality of insulating layers.

The first barrier layer BRL1 and the second barrier layer BRL2 may be on the substrate 100.

The second metal layer BML2 may be on the second barrier layer BRL2. The second metal layer BML2 may block external light from reaching the pixel circuit PC. In some embodiments, a constant voltage or a signal may be applied to the second metal layer BML2, and may prevent or reduce damage to the pixel circuit PC due to static discharge. The second metal layer BML2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The second metal layer BML2 may include a single layer or multiple layers including the above-described material. In an embodiment, the thickness of the second metal layer BML2 may be equal to or different from the thickness of the first metal layer BML1 of FIG. 9. In an embodiment, the thickness of the second metal layer BML2 may be greater than the thickness of the first metal layer BML1 of FIG. 9 in the third direction (e.g., z direction or -z direction). In an embodiment, an upper blocking layer UBL, an upper barrier layer UBRL, and a second metal layer BML2 may prevent or reduce the reflection or scattering of light in the pixel area PA. The second metal layer BML2 may protect the pixel circuit PC during a laser process of removing an opposite electrode 225 from the transmission area.

The display element layer 220 may be on the pixel circuit layer 210. The display element layer 220 may include a display element. In an embodiment, the display element layer 220 may include a first organic light-emitting diode OLED1 as a first display element, a second organic light-emitting diode OLED2 as a second display element, a third organic light-emitting diode OLED3 as a third display element, a fourth organic light-emitting diode OLED4 as a fourth display element, and a pixel defining layer 227. The display element may overlap the pixel area PA in a plan view. In an embodiment, the first organic light-emitting diode OLED1, the second organic light-emitting diode OLED2, the third organic light-emitting diode OLED3, the fourth organic light-emitting diode OLED4, the first adjacent organic light-emitting diode AOLED1, and the second adjacent organic light-emitting diode AOLED2 may overlap the pixel area PA.

The first organic light-emitting diode OLED1, the second organic light-emitting diode OLED2, the third organic light-emitting diode OLED3, and the fourth organic light-emitting diode OLED4 may emit light of the same color. In an embodiment, the first organic light-emitting diode OLED1, the second organic light-emitting diode OLED2, the third organic light-emitting diode OLED3, and the fourth organic light-emitting diode OLED4 may emit light in a green wavelength band.

The pixel defining layer 227 may define a first opening OP1, a second opening OP2, a third opening OP3, and a fourth opening OP4 therein. The first opening OP1 may define an emission area of the first organic light-emitting diode OLED1. The second opening OP2 may define an emission area of the second organic light-emitting diode OLED2. The third opening OP3 may define an emission area of the third organic light-emitting diode OLED3. The fourth opening OP4 may define an emission area of the fourth organic light-emitting diode OLED4.

A first distance d1 between the first opening OP1 and the second opening OP2 may be less than a second distance d2 between the second opening OP2 and the third opening OP3. The first distance d1 may be the shortest distance between the first opening OP1 and the second opening OP2 in the second direction (e.g., y direction or -y direction). The second distance d2 may be the shortest distance between the second opening OP2 and the third opening OP3 in the second direction (e.g., y direction or -y direction).

The encapsulation layer 300 may be on the display layer 200. In an embodiment, the encapsulation layer 300 may include a first inorganic encapsulation layer 310, an organic encapsulation layer 320, and a second inorganic encapsulation layer 330, which are sequentially stacked.

The touch sensor layer 400 may be on the encapsulation layer 300. The touch sensor layer 400 may include a touch conductive pattern. In an embodiment, the touch sensor layer 400 may include a first touch insulating layer 410, a first touch conductive pattern 420, a second touch insulating layer 430, a second touch conductive pattern 440, and a third touch insulating layer 450. In an embodiment, the first touch conductive pattern 420 and the second touch conductive pattern 440 may not overlap the pixel defining layer 227 between the first opening OP1 and the second opening OP2 in a plan view. In an embodiment, the first touch conductive pattern 420 and the second touch conductive pattern 440 may not overlap the pixel defining layer 227 between the third opening OP3 and the fourth opening OP4 in a plan view.

The anti-reflective layer 500 may be on the touch sensor layer 400. That is, the touch sensor layer 400 may be between the display element layer 220 and the anti-reflective layer 500. The anti-reflective layer 500 may include a black matrix 510, a color filter 530, and a planarization layer 550.

The black matrix 510 may overlap the pixel area PA in a plan view. The black matrix 510 may define a first upper opening UOP1 and a second upper opening UOP2. The first upper opening UOP1 may overlap the first opening OP1 and the second opening OP2. In other words, one first upper opening UOP1 may overlap the first opening OP1 and the second opening OP2. In an embodiment, the first upper opening UOP1 may completely overlap the first opening OP1 and the second opening OP2 in a plan view. Therefore, the black matrix 510 may not be between the first opening OP1 and the second opening OP2. The second upper opening UOP2 may overlap the third opening OP3 and the fourth opening OP4. In other words, one second upper opening UOP2 may overlap the third opening OP3 and the fourth opening OP4. In an embodiment, the second upper opening UOP2 may completely overlap the third opening OP3 and the fourth opening OP4 in a plan view. Therefore, the black matrix 510 may not be between the third opening OP3 and the fourth opening OP4.

The size of the first upper opening UOP1 may be greater than the total size of the first opening OP1 and the second opening OP2 in a plan view. The size of the first upper opening UOP1 may be the planar area of the first upper opening UOP1 in a plan view. The size of the first opening OP1 may be the planar area of the first opening OP1 in a plan view. The size of the second opening OP2 may be the planar area of the second opening OP2 in a plan view. In an embodiment, a width UOPd1 of the first upper opening UOP1 in the second direction (e.g., y direction or −y direction) may be greater than sum of a width OPd1 of the first opening OP1 and a width OPd2 of the second opening OP2 in the second direction. The width UOPd1 of the first upper opening UOP1 may be the shortest distance in the second direction between a portion of the black matrix 510 and the adjacent portion of the black matrix 510, which that face each other and define the first upper opening UOP1. The width OPd1 of the first opening OP1 may be the shortest distance in the second direction between a portion of the pixel defining layer 227 and the adjacent portion of the pixel defining layer 227, which define the first opening OP1. The width OPd2 of the second opening OP2 may be the shortest distance in the second direction between a portion of the pixel defining layer 227 and the adjacent portion of the pixel defining layer 227, which define the second opening OP2. Therefore, light emitted from the first organic light-emitting diode OLED1 and the second organic light-emitting diode OLED2 may travel at a wide angle.

The size of the second upper opening UOP2 may be greater than the sum of the size of the third opening OP3 and the fourth opening OP4 in a plan view. The size of the second upper opening UOP2 may be the planar area of the second upper opening UOP2. The size of the third opening OP3 may be the planar area of the third opening OP3. The size of the fourth opening OP4 may be the planar area of the fourth opening OP4 in a plan view. In an embodiment, a width UOPd2 of the second upper opening UOP2 in the second direction (e.g., y direction or −y direction) may be greater than the sum of a width OPd3 of the third opening OP3 and a width OPd4 of the fourth opening OP4. The width UOPd2 of the second upper opening UOP2, the width OPd3 of the third opening OP3, and the width OPd4 of the fourth opening OP4 may be defined similarly to the width UOPd1 of the first upper opening UOP1, the width OPd1 of the first opening OP1, and the width OPd2 of the second opening OP2, respectively. Therefore, light emitted from the third organic light-emitting diode OLED3 and the fourth organic light-emitting diode OLED4 may travel at a wide angle.

The black matrix 510 may overlap the first touch conductive pattern 420 and the second touch conductive pattern 440 in a plan view. Therefore, the reflection of light due to the first touch conductive pattern 420 and the second touch conductive pattern 440 may be effectively prevented or reduced.

The color filter 530 may include a first color filter 530A and a second color filter 530B. The first color filter 530A may overlap the first organic light-emitting diode OLED1, the second organic light-emitting diode OLED2, the third organic light-emitting diode OLED3, and the fourth organic light-emitting diode OLED4 in a plan view.

The first color filter 530A may overlap the first upper opening UOP1. The first color filter 530A may overlap the second upper opening UOP2. In an embodiment, the first color filter 530A may overlap the first upper opening UOP1 and the second upper opening UOP2. The first color filter 530A may overlap the first opening OP1, the second opening OP2, the third opening OP3, and the fourth opening OP4 in a plan view. In an embodiment, the first color filter 530A may overlap at least a portion of the black matrix 510. In an embodiment, one first color filter 530A may overlap the first upper opening UOP1 and the second upper opening UOP2. In another embodiment, a plurality of first color filters 530A may overlap the first upper opening UOP1 and the second upper opening UOP2, respectively. In an embodiment, the first color filter 530A may include a green pigment or dye.

The second color filter 530B may overlap at least a portion of the first color filter 530A in a plan view. The second color filter 530B may include a red pigment or dye.

Figure 13:
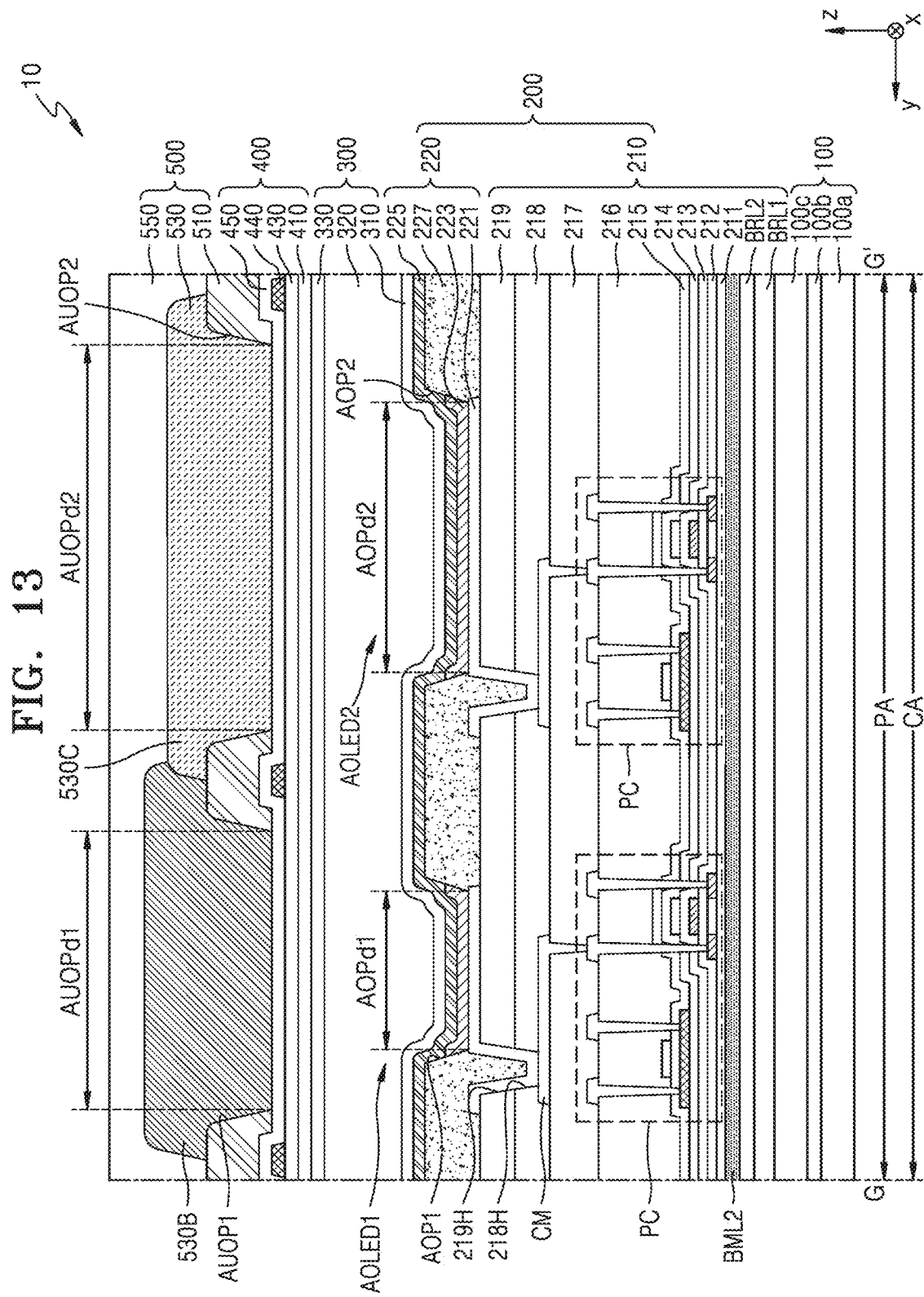
FIG. 13 is a schematic cross-sectional view of the display panel taken along line G-G' of FIG. 11B.

FIG. 13 is a schematic cross-sectional view of the display panel 10 taken along line G-G' of FIG. 11B. In FIG. 13, the same reference numerals as those in FIGS. 11A, 11B, and 12 denote the same members, and redundant descriptions thereof are omitted.

Referring to FIG. 13, the display panel 10 may include a substrate 100, a display layer 200, an encapsulation layer 300, a touch sensor layer 400, and an anti-reflective layer 500. The substrate 100 may include a main area and a component area CA. The component area CA may include a pixel area PA and a transmission area.

The display layer 200 may be on the substrate 100. The display layer 200 may include a pixel circuit layer 210 and a display element layer 220. The pixel circuit layer 210 may include a first barrier layer BRL1, a second barrier layer BRL2, a second metal layer BML2, a pixel circuit PC, a connection electrode CM, and a plurality of insulating layers.

The display element layer 220 may be on the pixel circuit layer 210. The display element layer 220 may include a display element. In an embodiment, the display element layer 220 may include a first adjacent organic light-emitting diode AOLED1 as a first adjacent display element, a second adjacent organic light-emitting diode AOLED2 as a second adjacent display element, and a pixel defining layer 227. In an embodiment, the first adjacent organic light-emitting diode AOLED1 and the second adjacent organic light-emitting diode AOLED2 may overlap the pixel area PA in a plan view.

The first adjacent organic light-emitting diode AOLED1 and the second adjacent organic light-emitting diode AOLED2 may emit light in different wavelength bands from each other. In an embodiment, the first adjacent organic light-emitting diode AOLED1 may emit light in a red wavelength band. The second adjacent organic light-emitting diode AOLED2 may emit light in a blue wavelength band.

The pixel defining layer 227 may include a first adjacent opening AOP1 and a second adjacent opening AOP2. The first adjacent opening AOP1 may define an emission area of the first adjacent organic light-emitting diode AOLED1. The second adjacent opening AOP2 may define an emission area of the second adjacent organic light-emitting diode AOLED2.

The encapsulation layer 300 may be on the display layer 200. In an embodiment, the encapsulation layer 300 may include a first inorganic encapsulation layer 310, an organic encapsulation layer 320, and a second inorganic encapsulation layer 330, which are sequentially stacked.

The touch sensor layer 400 may be on the encapsulation layer 300. The touch sensor layer 400 may include a touch conductive pattern. In an embodiment, the touch sensor layer 400 may include a first touch insulating layer 410, a second touch insulating layer 430, a second touch conductive pattern 440, and a third touch insulating layer 450.

The anti-reflective layer 500 may be on the touch sensor layer 400. That is, the touch sensor layer 400 may be between the display element layer 220 and the anti-reflective layer 500. The anti-reflective layer 500 may include a black matrix 510, a color filter 530, and a planarization layer 550.

The black matrix 510 may overlap the pixel area PA in a plan view. The black matrix 510 may include a first adjacent upper opening AUOP1 and a second adjacent upper opening AUOP2.

The first adjacent upper opening AUOP1 may overlap the first adjacent opening AOP1 in a plan view. The planar area of the first adjacent upper opening AUOP1 may be greater than the planar area of the first adjacent opening AOP1. In an embodiment, a width AUOPd1 of the first adjacent upper opening AUOP1 in the second direction (e.g., y direction or −y direction) may be greater than a width AOPd1 of the first adjacent opening AOP1. The width AUOPd1 of the first adjacent upper opening AUOP1 may be the shortest distance in the second direction between a portion of the black matrix 510 and the adjacent portion of the black matrix 510, which that face each other and define the first adjacent upper opening AUOP1. The width AOPd1 of the first adjacent opening AOP1 may be the shortest distance in the second direction between a portion of the pixel defining layer 227 and the adjacent portion of the pixel defining layer 227, which define the first adjacent opening AOP1. Therefore, light emitted from the first adjacent organic light-emitting diode AOLED1 may travel at a wide angle.

The second adjacent upper opening AUOP2 may overlap the second adjacent opening AOP2 in a plan view. The planar area of the second adjacent upper opening AUOP2 may be greater than the planar area of the second adjacent opening AOP2. In an embodiment, a width AUOPd2 of the second adjacent upper opening AUOP2 in the second direction (e.g., y direction or −y direction) may be greater than a width AOPd2 of the second adjacent opening AOP2. The width AUOPd2 of the second adjacent upper opening AUOP2 may be the shortest distance in the second direction between a portion of the black matrix 510 and the adjacent portion of the black matrix 510, which that face each other and define the second adjacent upper opening AUOP2. The width AOPd2 of the second adjacent opening AOP2 may be the shortest distance in the second direction between a portion of the pixel defining layer 227 and the adjacent portion of the pixel defining layer 227, which define the second adjacent opening AOP2. Therefore, light emitted from the second adjacent organic light-emitting diode AOLED2 may travel at a wide angle.

In an embodiment, the width AOPd2 of the second adjacent opening AOP2 in the second direction (e.g., y direction or −y direction) may be greater than the width AOPd1 of the first adjacent opening AOP1. In an embodiment, the width AUOPd2 of the second adjacent upper opening AUOP2 may be greater than the width AUOPd1 of the first adjacent upper opening AUOP1 in the second direction.

The black matrix 510 may overlap the first touch conductive pattern 420 and the second touch conductive pattern 440. Therefore, the reflection of light due to the first touch conductive pattern 420 and the second touch conductive pattern 440 may be prevented or reduced.

The color filter 530 may include a second color filter 530B and a third color filter 530C. The second color filter 530B may overlap the first adjacent organic light-emitting diode AOLED1. The third color filter 530C may overlap the second adjacent organic light-emitting diode AOLED2.

The second color filter 530B may overlap the first adjacent upper opening AUOP1 in a plan view. The second color filter 530B may overlap the first adjacent opening AOP1. In an embodiment, the second color filter 530B may overlap at least a portion of the black matrix 510. In an embodiment, the second color filter 530B may include a red pigment or dye.

The third color filter 530C may overlap the second adjacent upper opening AUOP2. The third color filter 530C may overlap the second adjacent opening AOP2. In an embodiment, the third color filter 530C may overlap at least a portion of the black matrix 510 in a plan view. In an embodiment, the third color filter 530C may overlap the second color filter 530B. In an embodiment, the third color filter 530C may include a blue pigment or dye.

Figure 14:
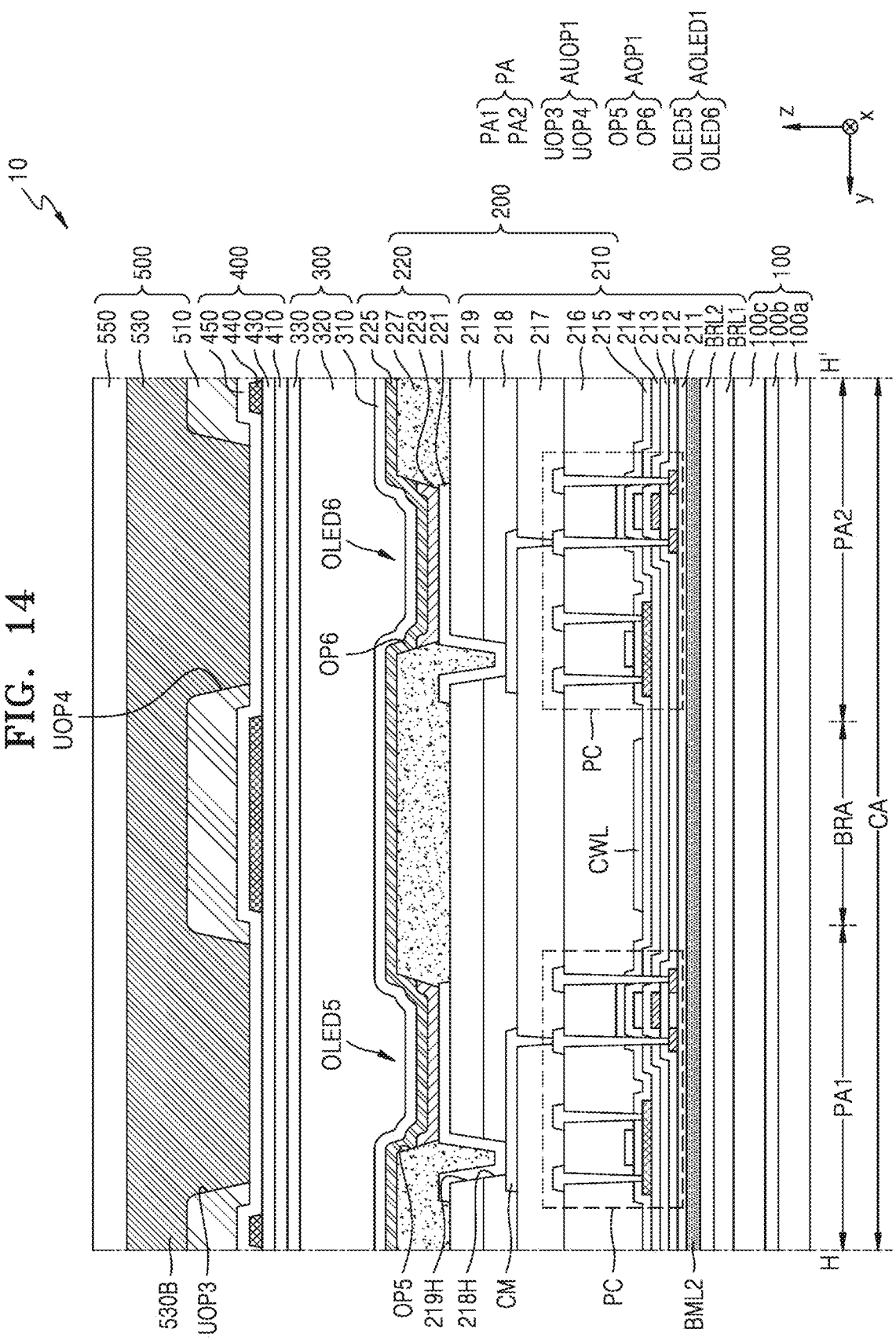
FIG. 14 is a schematic cross-sectional view of the display panel taken along line H-H' of FIG. 11B, according to an embodiment.

FIG. 14 is a schematic cross-sectional view of the display panel 10 taken along line H-H' of FIG. 11B, according to an embodiment. In FIG. 14, the same reference numerals as those in FIGS. 11A, 11B, and 13 denote the same members, and redundant descriptions thereof are omitted.

Referring to FIG. 14, the display panel 10 may include a substrate 100, a display layer 200, an encapsulation layer 300, a touch sensor layer 400, and an anti-reflective layer 500. The substrate 100 may include a main area and a component area CA. The component area CA may include a pixel area PA, a transmission area, and a bridge area BRA.

A plurality of pixel areas PA may be provided. In an embodiment, the plurality of pixel areas PA may be arranged in the first direction (e.g., x direction or −x direction) and/or the second direction (e.g., y direction or −y direction). The plurality of pixel areas PA may be spaced apart from each other in the first direction (e.g., x direction or −x direction) and/or the second direction (e.g., y direction or −y direction). The pixel area PA may include a first pixel area PA1 and a second pixel area PA2. In an embodiment, the first pixel area PA1 and the second pixel area PA2 may be spaced apart from each other in the first direction (e.g., x direction or −x direction) and/or the second direction (e.g., y direction or −y direction). For example, the first pixel area PA1 and the second pixel area PA2 may be spaced apart from each other in the first direction (e.g., x direction or −x direction).

The bridge area BRA may be between the adjacent pixel areas PA. The bridge area BRA may extend between the adjacent pixel areas PA. The bridge area BRA may extend between the first pixel area PA1 and the second pixel area PA2.

The display layer 200 may be on the substrate 100. The display layer 200 may include a pixel circuit layer 210 and a display element layer 220. The pixel circuit layer 210 may include a first barrier layer BRL1, a second barrier layer BRL2, a second metal layer BML2, a pixel circuit PC, a connection line CWL, a connection electrode CM, and a plurality of insulating layers.

The connection line CWL may be arranged in the bridge area BRA. The connection line CWL may extend in a direction in which the bridge area BRA extends. In an embodiment, the connection line CWL may be between a second inorganic insulating layer 215 and an interlayer-insulating layer 216. In another embodiment, the connection line CWL may be between a first inorganic insulating layer 212 and a gate insulating layer 213. In another embodiment, the connection line CWL may be between the gate insulating layer 213 and the intermediate insulating layer 214. In another embodiment, the connection line CWL may be between the interlayer-insulating layer 216 and the first organic insulating layer 217. In another embodiment, the connection line CWL may be between the first organic insulating layer 217 and the second organic insulating layer 218. The connection line CWL may be configured to transmit a signal and/or a power supply voltage to the pixel circuit PC arranged in the pixel area PA.

The display element layer 220 may be on the pixel circuit layer 210. The display element layer 220 may include a display element. In an embodiment, the display element layer 220 may include a first adjacent organic light-emitting diode AOLED1 as a first adjacent display element. The first adjacent organic light-emitting diode AOLED1 may include a fifth organic light-emitting diode OLED5 and a sixth organic light-emitting diode OLED6. The fifth organic light-emitting diode OLED5 and the sixth organic light-emitting diode OLED6 may emit light of the same color. In an embodiment, the fifth organic light-emitting diode OLED5 and the sixth organic light-emitting diode OLED6 may emit light in a red wavelength band. In an embodiment, the fifth organic light-emitting diode OLED5 may overlap the first pixel area PA1, and the sixth organic light-emitting diode OLED6 may overlap the second pixel area PA2 in a plan view.

A pixel defining layer 227 may include a first adjacent opening AOP1. The first adjacent opening AOP1 may define an emission area of the first adjacent organic light-emitting diode AOLED1. The first adjacent opening AOP1 may include the fifth opening OP5 and the sixth opening OP6. The fifth opening OP5 may define an emission area of the fifth organic light-emitting diode OLED5. The sixth opening OP6 may define an emission area of the sixth organic light-emitting diode OLED6.

The encapsulation layer 300 may be on the display layer 200. In an embodiment, the encapsulation layer 300 may include a first inorganic encapsulation layer 310, an organic encapsulation layer 320, and a second inorganic encapsulation layer 330, which are sequentially stacked.

The touch sensor layer 400 may be on the encapsulation layer 300. The touch sensor layer 400 may include a touch conductive pattern. In an embodiment, the touch sensor layer 400 may include a first touch insulating layer 410, a second touch insulating layer 430, a second touch conductive pattern 440, and a third touch insulating layer 450. In an embodiment, the second touch conductive pattern 440 may overlap at least one of the first pixel area PA1, the bridge area BRA, and the second pixel area PA2 in a plan view.

The anti-reflective layer 500 may be on the touch sensor layer 400. That is, the touch sensor layer 400 may be between the display element layer 220 and the anti-reflective layer 500. The anti-reflective layer 500 may include a black matrix 510, a color filter 530, and a planarization layer 550.

The black matrix 510 may overlap the first pixel area PA1, the bridge area BRA, and the second pixel area PA2 in a plan view. Therefore, the reflection of light due to lines or wirings overlapping the first pixel area PA1, the bridge area BRA, and the second pixel area PA2 may be prevented or reduced. The black matrix 510 may define a first adjacent upper opening AUOP1 therein.

The first adjacent upper opening AUOP1 may overlap the first adjacent opening AOP1 in a plan view. The planar area of the first adjacent upper opening AUOP1 may be greater than the planar area of the first adjacent opening AOP1. Therefore, light emitted from the first adjacent organic light-emitting diode AOLED1 may travel at a wide angle.

The first adjacent upper opening AUOP1 may include a third upper opening UOP3 and a fourth upper opening UOP4. The third upper opening UOP3 may overlap the fifth opening OP5. The fourth upper opening UOP4 may overlap the sixth opening OP6.

The color filter 530 may further include a second color filter 530B. The second color filter 530B may overlap the first adjacent organic light-emitting diode AOLED1. The second color filter 530B may overlap the first adjacent upper opening AUOP1. The second color filter 530B may overlap the first adjacent opening AOP1. In an embodiment, the second color filter 530B may overlap at least a portion of the black matrix 510 in a plan view. In an embodiment, the second color filter 530B may overlap at least a portion of the first color filter 530A. In an embodiment, the second color filter 530B may include a red pigment or dye.

The second color filter 530B may overlap the bridge area BRA in a plan view. The second color filter 530B may extend from the first pixel area PA1 to the second pixel area PA2. In an embodiment, the second color filter 530B may extend from the first pixel area PA1 to the second pixel area PA2 and be disposed between the first transmission area TA1 and the second transmission area TA2. In an embodiment, the third upper opening UOP3 overlapping the first pixel area PA1 and the fourth upper opening UOP4 overlapping the second pixel area PA2 may overlap the same second color filter 530B in a plan view. The second color filter 530B may prevent or reduce the reflection of light due to the connection line CWL and/or the second touch conductive pattern 440 in the bridge area BRA.

Figure 15:
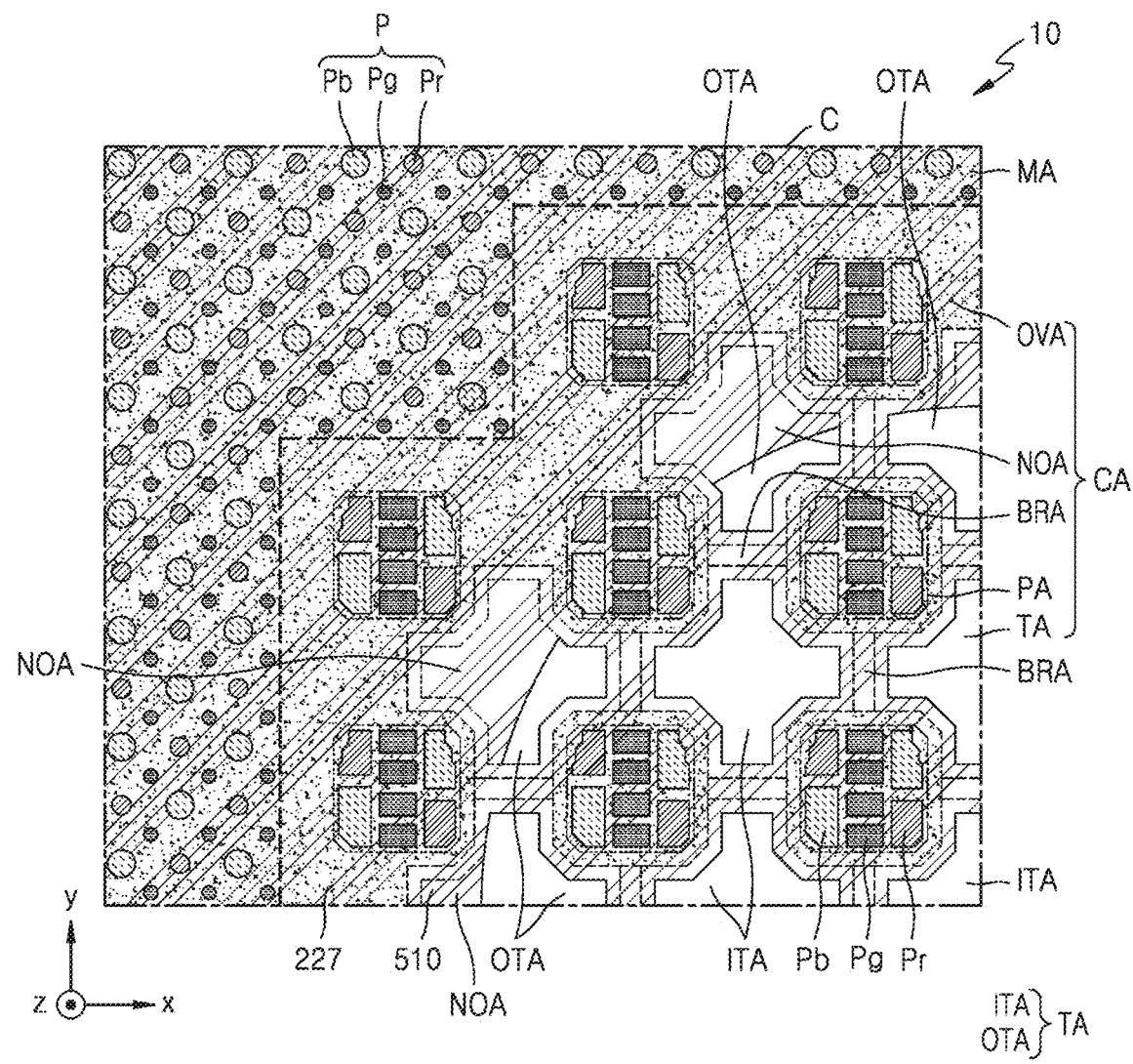
FIG. 15 is an enlarged view of region C in the display panel of FIG. 5.

FIG. 15 is an enlarged view of region C in the display panel 10 of FIG. 5. In FIG. 15, the same reference numerals as those in FIG. 9 denote the same members, and redundant descriptions thereof are omitted.

Referring to FIG. 15, the display panel 10 may include a substrate 100, a pixel defining layer 227, a display element, and a black matrix 510. The substrate 100 may include a component area CA and a main area MA. In an embodiment, the component area CA may include a pixel area PA, a transmission area TA, a bridge area BRA, an overlap area OVA, and a non-overlap area NOA.

The transmission area TA may be adjacent to the pixel area PA. In an embodiment, the transmission area TA may be between the plurality of pixel areas PA. The transmission area TA may be an area in the component area CA other than the pixel area PA, the bridge area BRA, the overlap area OVA, and the non-overlap area NOA. The display element may not be arranged in the transmission area TA. Therefore, the light transmittance of the display panel 10 in the transmission area TA may be higher than the light transmittance of the display panel 10 in the pixel area PA.

A plurality of transmission areas TA may be provided. The plurality of transmission areas TA may be arranged in the first direction (e.g., x direction or −x direction) and/or the second direction (e.g., y direction or −y direction). In an embodiment, the transmission area TA may include an inner transmission area ITA and an outer transmission area OTA. The outer transmission area OTA may be between the main area MA and the inner transmission area ITA. A plurality of inner transmission area ITA and a plurality of outer transmission area OTA may be provided. In an embodiment, the plurality of outer transmission areas OTA may surround at least part of the plurality of inner transmission areas ITA. In an embodiment, the planar shape of the inner transmission area ITA may be a cross shape. In an embodiment, at least a portion of the edge of the outer transmission area OTA may have a round shape in a plan view. In an embodiment, the edge of the outer transmission area OTA may be defined as the edge of the black matrix 510. In an embodiment, the edge of the black matrix 510 having a round shape in a plan view may define at least a portion of the edge of the outer transmission area OTA.

The overlap area OVA may be between the main area MA and the transmission area TA. In an embodiment, the pixel defining layer 227 and the black matrix 510 may overlap each other in the overlap area OVA in a plan view. The overlapping area OVA may surround each of the plurality of pixel areas PA arranged at the outermost side of the component area CA.

The non-overlap area NOA may be between the overlap area OVA and the transmission area TA. In an embodiment, the non-overlap area NOA may be between the overlap area OVA and the outer transmission area OTA. In an embodiment, at least a portion of the edge of the non-overlap area NOA may have a round shape. In an embodiment, the black matrix 510 may be arranged in the non-overlap area NOA, but the pixel defining layer 227 may not be arranged therein. Therefore, the pixel defining layer 227 and the black matrix 510 may not overlap each other in the non-overlap area NOA. A plurality of non-overlap areas NOA may be provided, and the plurality of non-overlap areas NOA may surround the outer transmission areas OTA. In an embodiment, the overall planar shape of one of the plurality of non-overlap areas NOA and one of the plurality of outer transmission areas OTA may be a cross shape.

The pixel defining layer 227 may be arranged in the main area MA, the overlap area OVA, and the pixel area PA. The pixel defining layer 227 may not be arranged in the non-overlap area OVA and the transmission area TA. Although not illustrated, in some embodiments, the pixel defining layer 227 may be arranged in the bridge area BRA.

The black matrix 510 may be arranged in the main area MA, the overlap area OVA, the non-overlap area NOA, the bridge area BRA, and the pixel area PA. The black matrix 510 may not be arranged in the transmission area TA. The above description has been given focusing on the case in which the black matrix 510 is arranged in the non-overlap area OVA and the pixel defining layer 227 is not arranged, but in another embodiment, the pixel defining layer 227 may be arranged in the non-overlap area OVA and the black matrix 510 may not be arranged therein.

Although FIGS. 1 to 15 illustrate that the anti-reflective layer 500 includes the black matrix 510, the color filter 530, and the planarization layer 550, but the disclosure is not limited thereto. In another embodiment, the anti-reflective layer 500 may include a reflection control layer on the black matrix 510, instead of the color filter 530. The reflection control layer may selectively absorb light of a certain band among pieces of light reflected from the inside of the display panel and/or the electronic device or pieces of light incident from the outside of the display panel and/or the electronic device.

FIGS. 10 to 15 illustrate that the color filter 530 is in the opening of the black matrix 510. For example, FIGS. 10 to 15 illustrate that the color filter 530 is in the upper opening 510OP of the black matrix 510 of FIG. 10. A reflection control layer according to another embodiment may be present in the opening of the black matrix 510. For example, the reflection control layer may be present in the upper opening 510OP of the black matrix 510 of FIG. 10.

For example, the reflection control layer may absorb a first wavelength band of about 490 nm to about 505 nm and a second wavelength band of about 585 nm to about 600 nm, so that light transmittance in the first wavelength band and the second wavelength band is about 40% or less. The reflection control layer may absorb light of wavelengths out of the wavelength ranges of red light, green light, and blue light respectively emitted from the first display element, the second display element, and the third display element. Because the reflection control layer absorbs light of wavelengths that do not belong to the wavelength ranges the red light, the green light, and the blue light emitted from the display elements, the reduction in the luminance of the display panel and/or the electronic device may be prevented or minimized. Also, the reduction in the luminescence efficiency of the display panel and/or the electronic device may be prevented or minimized, and the visibility of the display panel and/or the electronic device may be improved.

The reflection control layer may include an organic material layer including a dye, a pigment, and/or any combination thereof. The reflection control layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer may have a transmittance of about 64% to about 72%. The transmittance of the reflection control layer may be controlled according to the amount of the pigment and/or the dye included in the reflection control layer. The reflection control layer overlaps the display elements in a plan view, but does not overlap the transmission area TA in a plan view. In a plan view, the transmission area TA may overlap the planarization layer 550 without overlapping the reflection control layer.

According to the embodiment including the reflection control layer, a capping layer and a low reflection layer may be additionally between the opposite electrode 225 and the encapsulation layer 300.

Due to the principle of constructive interference, the capping layer may improve the luminescence efficiency of the display element. The capping layer may include, for example, a material having a refractive index of about 1.6 or greater for light having a wavelength of about 589 nm.

The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer may be on the capping layer. The low reflection layer may include an inorganic material having low reflectance. In an embodiment, the low reflection layer may include a metal or a metal oxide. When the low reflection layer includes a metal, the low reflection layer may include, for example, ytterbium (Yb), bismuth (Bi), cobalt (Co), molybdenum (Mo), titanium (Ti), zirconium (Zr), aluminum (Al), chromium (Cr)), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer includes a metal oxide, the low reflection layer may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, and/or any combination.

In an embodiment, the inorganic material included in the low reflection layer may have an absorption coefficient (k) of greater than 0.5 and less than or equal to 4.0 ($0.5<k\leq4.0$). Also, the inorganic material included in the low reflection layer may have a refractive index (n) of 1 or more ($n\geq1.0$).

The low reflection layer induces destructive interference between light incident on the display panel and/or the electronic device and light reflected from the metal below the low reflection layer, so that external light reflectance may be reduced. Therefore, the display quality and visibility of the display panel and/or the electronic device may be improved.

In some embodiments, the capping layer may be omitted and the low reflection layer may be in contact with the opposite electrode 225.

As described above, the display panel according to the embodiment may include the black matrix on the display element layer, where the black matrix defines the first upper opening overlapping the first opening of the pixel defining layer and the second opening of the pixel defining layer in a plan view, and the anti-reflective layer including the first color filter overlapping the first upper opening in a plan view. Therefore, the light transmittance of the display panel in the component area may be effectively increased and the light reflectance of the display panel may be effectively reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
 a housing having a rear surface and a side surface;
 a cover window on the housing;
 a display panel below the cover window; and
 a component between the housing and the display panel, wherein the display panel comprises:
  a substrate comprising a component area and a main area surrounding at least a portion of the component area, wherein the component area comprises a pixel area and a transmission area and overlaps the component in a plan view;
  a display element layer on the substrate, wherein the display element layer comprises a first display element overlapping the pixel area of the component area, a second display element overlapping the pixel area of the component area in the plan view, a third display element overlapping the pixel area of the component area, and a pixel defining layer defining therein a first opening, a second opening, and a third opening, and the first opening, the second opening, and the third opening define therein an emission area of the first display element an emission area of the second display element, and an emission area of the third display element, respectively; and
  an anti-reflective layer on the display element layer, wherein the anti-reflective layer comprises a black matrix defining therein a first upper opening overlapping the first opening and the second opening, and a first color filter overlapping the first upper opening, the first opening, the second opening, and the third opening in the plan view.

2. The electronic device of claim 1, wherein the display element layer further comprises and a fourth display element overlapping the pixel area of the component area in the plan view,
 the pixel defining layer further defines therein a fourth opening defining an emission area of the fourth display element, and the first color filter further overlaps the fourth opening in the plan view, and
 the black matrix further defines therein a second upper opening overlapping the third opening and the fourth opening in the plan view.

3. The electronic device of claim 2, wherein a distance between the first opening and the second opening is less than a distance between the second opening and the third opening in the plan view.

4. The electronic device of claim 2, wherein the first display element, the second display element, the third display element, and the fourth display element emit light of a same color.

5. The electronic device of claim 2, wherein the first color filter overlaps the first upper opening and the second upper opening in the plan view.

6. The electronic device of claim 2, wherein the display element layer further comprises a first adjacent display element overlapping the pixel area of the component area in the plan view and which emits light in a wavelength band different from a wavelength band of light emitted from the first display element, and a second adjacent display element overlapping the pixel area of the component area in the plan view and which emits light in a wavelength band different from the wavelength bands of the lights emitted from of the first display element and the first adjacent display element,
 the pixel defining layer further defines therein a first adjacent opening and a second adjacent opening defining an emission area of the first adjacent display element and an emission area of the second adjacent display element, respectively,
 the black matrix further defines therein a first adjacent upper opening overlapping the first adjacent opening and a second adjacent upper opening overlapping the second adjacent opening in the plan view, and the anti-reflective layer further comprises a second color filter overlapping the first adjacent upper opening and a third color filter overlapping the second adjacent upper opening in the plan view.

7. The electronic device of claim 6, wherein a planar area of the first adjacent upper opening is greater than a planar area of the first adjacent opening in the plan view.

8. The electronic device of claim 6, wherein the pixel area of the component area comprises a first pixel area and a second pixel area, the transmission area of the component area comprises a first transmission area and a second transmission area each adjacent to the first pixel area and the second pixel area, and the first color filter extends from the first pixel area to the second pixel area and is disposed between the first transmission area and the second transmission area.

9. The electronic device of claim 6, wherein the display panel further comprises a touch sensor layer between the display element layer and the anti-reflective layer, the touch sensor layer comprises a touch conductive pattern, the black matrix overlaps the touch conductive pattern in the plan view, the touch conductive pattern extends between the first adjacent opening and the second adjacent opening in the plan view, the touch conductive pattern extends between the second opening and the third opening in the plan view, and the touch conductive pattern surrounds at least part of the first opening, the second opening, and the pixel defining layer between the first opening and the second opening in the plan view.

10. The electronic device of claim 1, wherein the display element layer further comprises a plurality of display elements overlapping the main area in the plan view and which emit light in a same wavelength band as a wavelength band of light emitted from the first display element, the pixel defining layer of the display element layer further defines therein a plurality of openings defining a plurality of emission areas of the plurality of display elements overlapping the main area in the plan view, the anti-reflective layer further comprises a plurality of color filters overlapping the main area in the plan view, the black matrix of the anti-reflective layer further defines therein a plurality of upper openings overlapping the plurality of openings in the main area, respectively, in the plan view, and the plurality of color filters of the anti-reflective layer overlap the plurality of upper openings, respectively, in the plan view.

11. A display panel comprising:

a substrate comprising a component area and a main area surrounding at least a portion of the component area, wherein the component area comprises a pixel area and a transmission area;

a display element layer on the substrate, wherein the display element layer comprises a first display element overlapping the pixel area of the component area in a plan view, a second display element overlapping the pixel area of the component area in the plan view, a third display element overlapping the pixel area of the component area, and a pixel defining layer defining therein a first opening, a second opening, and a third opening and the first opening, the second opening, and the third opening define an emission area of the first display element, an emission area of the second display element, and an emission area of the third display element, respectively; and an anti-reflective layer on the display element layer, wherein the anti-reflective layer comprises a black matrix defining therein a first upper opening overlapping the first opening and the second opening, and a first color filter overlapping the first upper opening, the first opening, the second opening, and the third opening in the plan view.

12. The display panel of claim 11, wherein the display element layer further comprises a fourth display element overlapping the pixel area of the component area in the plan view, the pixel defining layer further defines therein a third opening and a fourth opening defining an emission area of the fourth display element, and the first color filter further overlaps the fourth opening in the plan view, and the black matrix further defines therein a second upper opening overlapping the third opening and the fourth opening in the plan view.

13. The display panel of claim 12, wherein a distance between the first opening and the second opening is less than a distance between the second opening and the third opening in the plan view.

14. The display panel of claim 12, wherein the first display element, the second display element, the third display element, and the fourth display element emit light of a same color.

15. The display panel of claim 12, wherein the first color filter overlaps the first upper opening and the second upper opening in the plan view.

16. The display panel of claim 12, wherein the display element layer further comprises a first adjacent display element overlapping the pixel area of the component area in the plan view and which emits light in a wavelength band different from a wavelength band of light emitted from the first display element, and a second adjacent display element overlapping the pixel area of the component area in the plan view and which emits light in a wavelength band different from the wavelength bands of the lights emitted from of the first display element and the first adjacent display element, the pixel defining layer further defines therein a first adjacent opening and a second adjacent opening defining an emission area of the first adjacent display element and an emission area of the second adjacent display element, respectively, the black matrix further defines therein a first adjacent upper opening overlapping the first adjacent opening and a second adjacent upper opening overlapping the second adjacent opening in the plan view, and the anti-reflective layer further comprises a second color filter overlapping the first adjacent upper opening and a third color filter overlapping the second adjacent upper opening in the plan view.

17. The display panel of claim 16, wherein a planar area of the first adjacent upper opening is greater than a planar area of the first adjacent opening in the plan view.

18. The display panel of claim 16, wherein the pixel area of the component area comprises a first pixel area and a second pixel area, the transmission area of the component area comprises a first transmission area and a second transmission area each adjacent to the first pixel area and the second pixel area, and the first color filter extends from the first pixel area to the second pixel area and is disposed between the first transmission area and the second transmission area.

19. The display panel of claim 16, further comprising a touch sensor layer between the display element layer and the anti-reflective layer, the touch sensor layer comprising a touch conductive pattern, wherein the black matrix overlaps the touch conductive pattern in the plan view, the touch conductive pattern extends between the first adjacent opening and the second adjacent opening in the plan view, the touch conductive pattern extends between the second opening and the third opening in the plan view, and the touch conductive pattern surrounds at least part of the first opening, the second opening, and the pixel defining layer between the first opening and the second opening in the plan view.

20. The display panel of claim 11, wherein the display element layer further comprises a plurality of display elements overlapping the main area in the plan view and which emit light in a same wavelength band as a wavelength band of light emitted from the first display element, the pixel defining layer of the display element layer further defines therein a plurality of openings defining a plurality of emission areas of the plurality of display elements overlapping the main area in the plan view, the anti-reflective layer further comprises a plurality of color filters overlapping the main area in the plan view, the black matrix of the anti-reflective layer further defines therein a plurality of upper openings overlapping the plurality of openings in the main area, respectively, in the plan view, and the plurality of color filters of the anti-reflective layer overlap the plurality of upper openings, respectively, in the plan view.

* * * * *